(12) United States Patent
Tamura

(10) Patent No.: US 11,499,684 B2
(45) Date of Patent: Nov. 15, 2022

(54) PLANAR LIGHT SOURCE AND THE METHOD OF MANUFACTURING THE SAME

(71) Applicant: NICHIA CORPORATION, Anan (JP)

(72) Inventor: Gensui Tamura, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 17/227,827

(22) Filed: Apr. 12, 2021

(65) Prior Publication Data

US 2021/0317957 A1 Oct. 14, 2021

(30) Foreign Application Priority Data

Apr. 13, 2020 (JP) .............................. JP2020-071742
Mar. 10, 2021 (JP) .............................. JP2021-037887

(51) Int. Cl.
*F21K 9/90* (2016.01)
*F21K 9/68* (2016.01)
*F21Y 105/16* (2016.01)

(52) U.S. Cl.
CPC ................. *F21K 9/90* (2013.01); *F21K 9/68* (2016.08); *F21Y 2105/16* (2016.08)

(58) Field of Classification Search
None
See application file for complete search history.

(56) References Cited

U.S. PATENT DOCUMENTS

| | | | | |
|---|---|---|---|---|
| 7,719,099 | B2 * | 5/2010 | Tseng | H01L 33/641 |
| | | | | 257/E33.057 |
| 8,232,564 | B2 * | 7/2012 | Chakraborty | H01L 33/44 |
| | | | | 257/E33.001 |
| 8,648,365 | B2 * | 2/2014 | Won | H01L 33/62 |
| | | | | 257/E33.056 |
| 8,823,021 | B2 * | 9/2014 | Kirihara | F21S 4/20 |
| | | | | 257/89 |
| 2009/0314534 | A1 | 12/2009 | Matsuoka et al. | |
| 2011/0037740 | A1 | 2/2011 | Yamaguchi | |
| 2011/0278618 | A1 * | 11/2011 | Nakayama | H01L 33/44 |
| | | | | 428/428 |
| 2011/0305003 | A1 | 12/2011 | Lee et al. | |
| 2012/0013811 | A1 | 1/2012 | Shimizu | |

(Continued)

FOREIGN PATENT DOCUMENTS

JP 2007095674 A 4/2007
JP 2007180022 A 7/2007

(Continued)

*Primary Examiner* — Elmito Breval
(74) *Attorney, Agent, or Firm* — Global IP Counselors, LLP

(57) ABSTRACT

A planar light source includes a light source, a light guide member, a wiring substrate, a light reflecting sheet and a pair of conducting members. The light source has a pair of electrodes on one face. The light guide member covers the light source while the electrodes are exposed from the light guide member. The wiring substrate has a wiring layer. The light reflecting sheet is interposed between the light guide member and the wiring substrate and defining a pair of first through holes at positions aligned with the electrodes on a one-to-one basis. The conducting members are respectively disposed in the first through holes and electrically connecting the electrodes to the wiring layer.

3 Claims, 23 Drawing Sheets

(56) References Cited

U.S. PATENT DOCUMENTS

| | | | |
|---|---|---|---|
| 2012/0181560 A1* | 7/2012 | Hiramatsu | H05K 1/02 |
| | | | 174/250 |
| 2013/0056773 A1* | 3/2013 | Yang | H01L 33/60 |
| | | | 257/E33.072 |
| 2013/0099276 A1* | 4/2013 | Fukushima | H01L 33/62 |
| | | | 257/99 |
| 2014/0061704 A1* | 3/2014 | Yamada | H01L 33/62 |
| | | | 438/27 |
| 2015/0369467 A1 | 12/2015 | Saito et al. | |
| 2018/0182940 A1 | 6/2018 | Yamamoto et al. | |
| 2018/0212129 A1 | 7/2018 | Saito et al. | |
| 2018/0341152 A1 | 11/2018 | Yamashita et al. | |
| 2018/0358521 A1 | 12/2018 | Marutani | |
| 2019/0227382 A1 | 7/2019 | Watanabe et al. | |
| 2019/0305200 A1 | 10/2019 | Liu et al. | |
| 2020/0049876 A1 | 2/2020 | Watanabe et al. | |
| 2020/0049877 A1 | 2/2020 | Watanabe et al. | |
| 2020/0089056 A1 | 3/2020 | Watanabe et al. | |
| 2020/0135993 A1 | 4/2020 | Yamamoto et al. | |
| 2021/0033772 A1 | 2/2021 | Watanabe et al. | |
| 2021/0041617 A1 | 2/2021 | Watanabe et al. | |

FOREIGN PATENT DOCUMENTS

| | | |
|---|---|---|
| JP | 2009252899 A | 10/2009 |
| JP | 2010003941 A | 1/2010 |
| JP | 2011210674 A | 10/2011 |
| JP | 2011221435 A | 11/2011 |
| JP | 2012003263 A | 1/2012 |
| JP | 2014017303 A | 1/2014 |
| JP | 2018097974 A | 6/2018 |
| JP | 2018106826 A | 7/2018 |
| JP | 2018107257 A | 7/2018 |
| JP | 2018198284 A | 12/2018 |
| JP | 2019003994 A | 1/2019 |
| TW | 200807764 A | 2/2008 |
| TW | 201942641 A | 11/2019 |
| WO | 2010070885 A1 | 6/2010 |
| WO | 2010113361 A1 | 10/2010 |
| WO | 2015059967 A1 | 4/2015 |
| WO | 2016017673 A1 | 2/2016 |
| WO | 2017098910 A1 | 6/2017 |
| WO | 2018116815 A1 | 6/2018 |
| WO | 2019225761 A1 | 11/2019 |

\* cited by examiner

PLANAR LIGHT SOURCE AND THE METHOD OF MANUFACTURING THE SAME

CROSS-REFERENCE TO RELATED APPLICATION

This application claims priority to Japanese Patent Application No. 2020-071742 filed on Apr. 13, 2020, and Japanese Patent Application No. 2021-037887 filed on Mar. 10, 2021, the disclosures of which are hereby incorporated by reference in their entireties.

BACKGROUND

The present disclosure relates to a planar light source and the method of manufacturing the same.

Planar light sources which employ light emitting diodes as light sources are used in many devices such as backlights for liquid crystal display televisions. It is necessary to effectively utilize the light from such a light source in order to increase the luminance and reduce the power consumption of the planar light source. For example, Japanese Unexamined Patent Application Publication No. 2019-003994 discloses a technique to increase the light extraction efficiency of a light emitting device in which a light emitting element is connected using wires that are exposed.

SUMMARY

One of the objects of the present disclosure is to provide a planar light source capable of hindering the wiring material from absorbing the light from a light source and a method of manufacturing the same.

A planar light source according to the present disclosure includes: a light source, a light guide member, a wiring substrate, a light reflecting sheet and a pair of conducting members. The light source has a pair of electrodes on one face. The light guide member covers the light source while the electrodes are exposed from the light guide member. The wiring substrate has a wiring layer. The light reflecting sheet is interposed between the light guide member and the wiring substrate and defining a pair of first through holes at positions aligned with the electrodes on a one-to-one basis. The conducting members are respectively disposed in the first through holes and electrically connecting the electrodes to the wiring layer.

A method of manufacturing a planar light source according to this disclosure includes: preparing a light emitting module including a light source having a pair of electrodes on one face, a light guide member covering the light source while the electrodes are exposed from the light guide member, and a first light reflecting sheet defining a pair of first through holes at positions aligned with the electrodes on a one-to-one basis; preparing a wiring substrate having a wiring layer; bonding the light emitting module to the wiring substrate; and electrically connecting the electrodes and the wiring layer via conducting members disposed in the first through holes.

Another method of manufacturing a planar light source according to this disclosure includes: preparing a wiring substrate on which a first light reflecting sheet defining a pair of first through holes is disposed, the wiring substrate having a wiring layer; preparing a light emitting module including a light source having a pair of electrodes on one face, a second light reflecting sheet defining a second through hole with the light source being disposed in the second through hole in a plan view, and a light guide member covering the light source while the electrodes are exposed from the light guide member; bonding the light emitting module to the wiring substrate with the first light reflecting sheet being interposed between the light emitting module and the wiring substrate such that the first through holes are aligned with the electrodes on a one-to-one basis; and electrically connecting the electrodes and the wiring layer via conducting members disposed in the first through holes.

According to the present disclosure, a planar light source capable of more effectively utilizing the emitted light from a light source by hindering the wiring material from absorbing light, and a method of manufacturing the same can be achieved.

DETAILED DESCRIPTION

Figure 1:
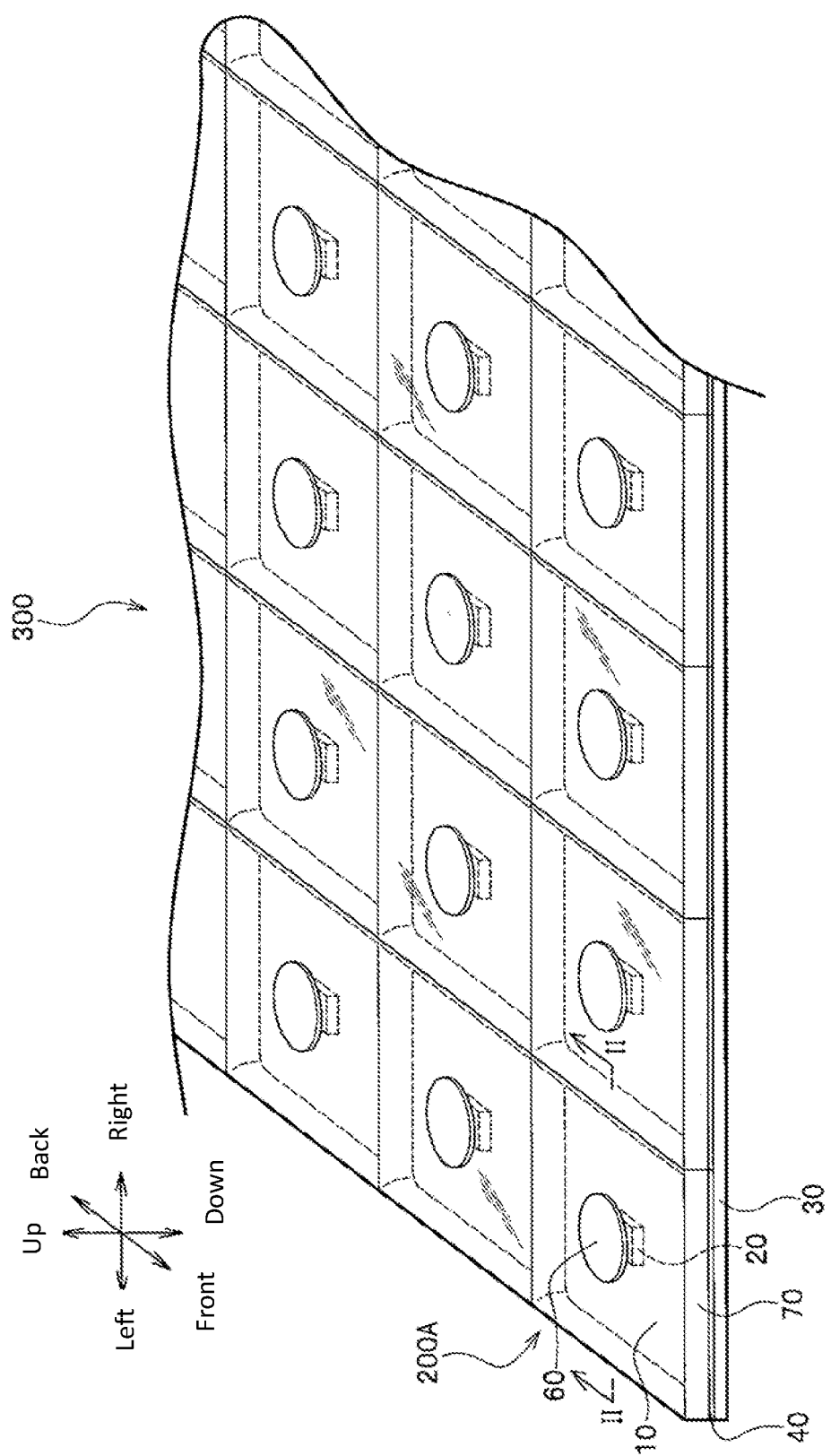
FIG. 1 is a schematic perspective view of a planar light source according to a first embodiment.

A planar light source and a manufacturing method according to certain embodiments will be explained below with reference to the accompanying drawings. The drawings referenced in the explanation of the embodiments below are schematic, and the sizes, spacing, and relative positions of the members might be exaggerated or partly omitted. Cross-sectional views might use an end view which only shows a cut section. In the explanation below, moreover, the same designations and reference numerals designate the same or similar members in principle, for which redundant explanation will be omitted as appropriate. In the description herein, words such as "upper," "lower," or the like merely indicate the relative positions of constituent elements shown in the referenced drawings for explanation purposes, and are not intended to indicate their absolute positions unless otherwise specifically noted.

First Embodiment

Planar Light Source

One example of a planar light source 200/300 according to a first embodiment will be explained with reference to FIG. 1 to FIG. 4. The planar light source 200 whose cross section is shown in FIG. 2 has the structure corresponding with a portion 200A of the planar light source 300 shown in FIG. 1. The planar light source 200 and the planar light source 300 differ in terms of the number of the light emitting modules described later, and individual light emitting modules have the same structure.

The planar light source 300 primarily includes a light source 20 having a pair of positive and negative electrodes on one face, a light guide member 10 covering the light source 20 so as to expose the electrodes 21, a wiring substrate 30 having a wiring layer 32 to which the electrodes 21 are electrically connected, a light reflecting sheet 40 interposed between the light guide member 10 and the wiring substrate 30. The light reflecting sheet 40 has first through holes 41 facing (aligned with) the pair of positive and negative electrodes 21 on a one-to-one basis. The electrodes 21 and the wiring layer 32 are electrically connected via the conducting members 50 disposed in the first through holes 41.

Each constituent of the planar light source 300 will be explained below. The light extraction face of the planar light source 300 is the upper face of the light guide member 10 positioned opposite the light reflecting sheet 40. In this embodiment, a light adjusting member 60 is disposed on the upper face of the light guide member 10.

Light Source

Figure 2:
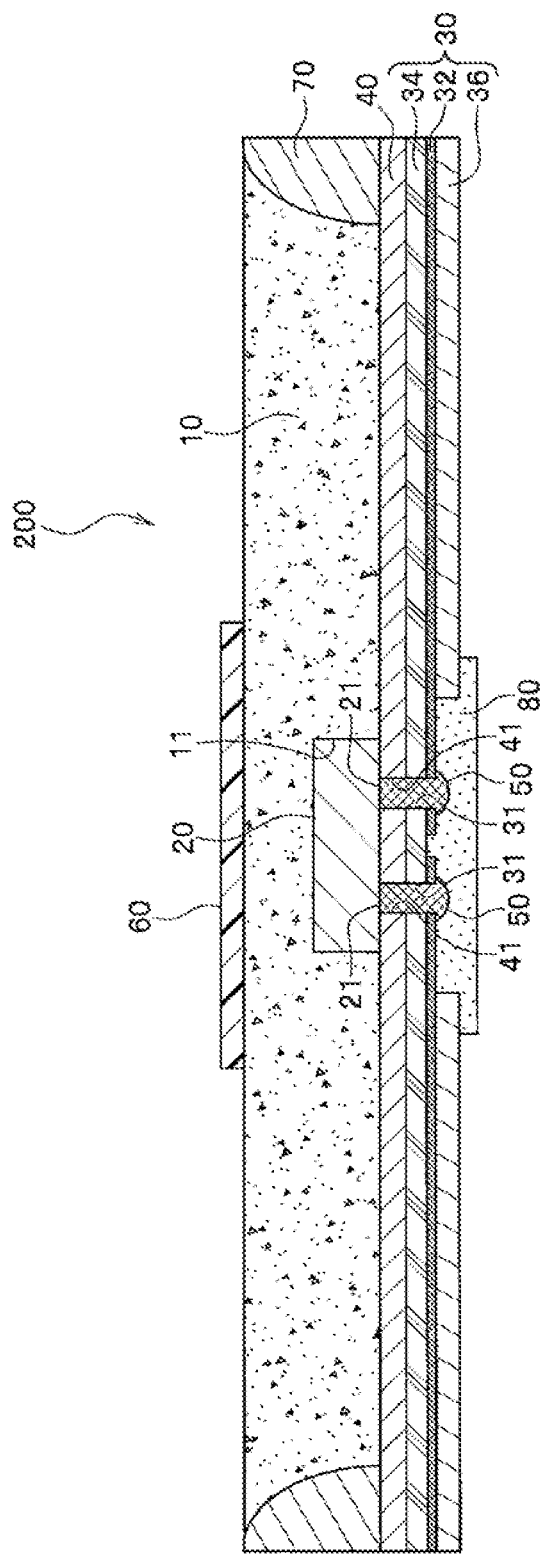
FIG. 2 is a schematic cross-sectional view taken along a line II-II in FIG. 1.
Figure 3A:
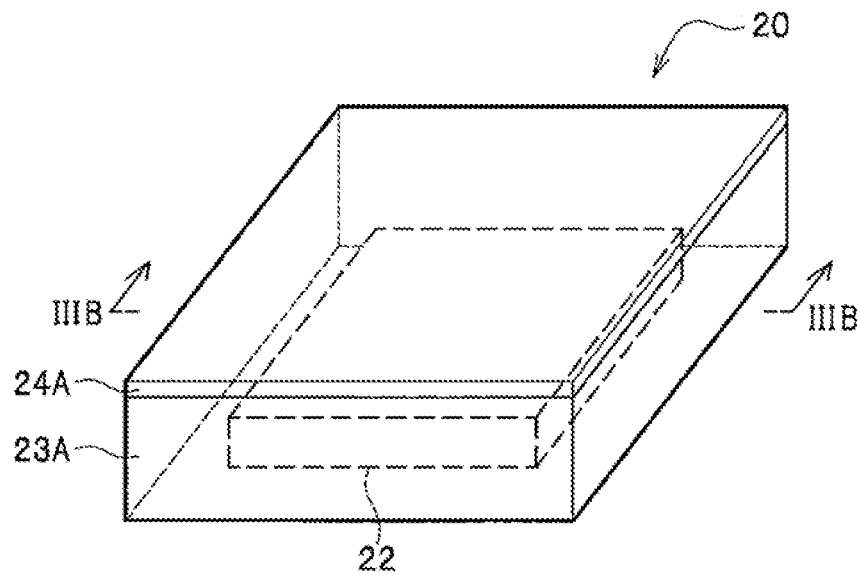
FIG. 3A is a schematic perspective view illustrating a light source according to the first embodiment.
Figure 3B:
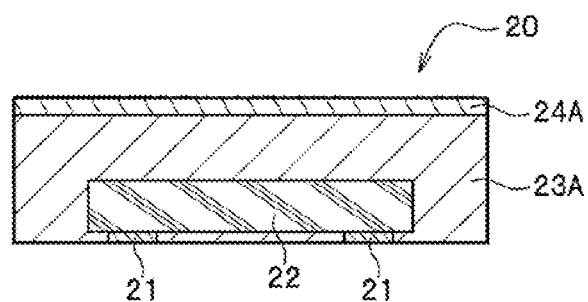
FIG. 3B is a schematic cross-sectional view taken along a line IIIB-IIIB in FIG. 3A.
Figure 3C:
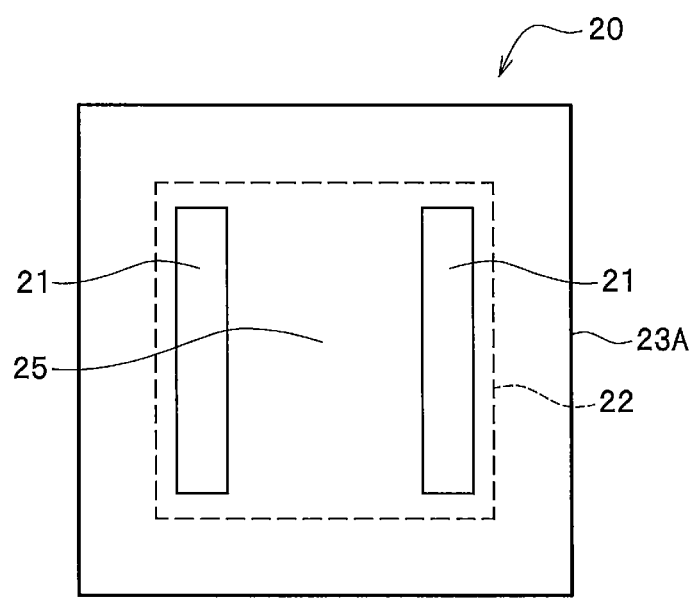
FIG. 3C is a schematic bottom view of the light source in FIG. 3A showing the face having electrodes.

As shown in FIG. 2 to FIG. 3C, a light source 20 has a pair of positive and negative electrodes 21 on one face, and emits light when a voltage is applied from the outside via the electrodes 21. The light source 20, as shown in FIG. 3A to FIG. 3C, includes a light emitting element 22, a light transmissive member 23A, and a first light adjusting member 24A. The light source 20 has a shape close to a rectangular cuboid, and has the pair of positive and negative electrodes 21 to be exposed at the lower face opposite the upper face where the light transmissive member 23A and the first light adjusting member 24A are disposed.

The light emitting element 22 includes a semiconductor stack, and in this embodiment at least the upper face and the lateral faces of the semiconductor stack are surrounded by the light transmissive member 23A. For the semiconductor stack, one constructed to emit visible light or ultraviolet light having a composition in accordance with a desired peak emission wavelength can be used. For example, a nitride semiconductor ($In_xAl_yGa_{1-x-y}N$ ($0 \leq x$, $0 \leq y$, $x+y \leq 1$)) or GaP capable of emitting blue or green light, or GaAlAs or AlInGaP capable of emitting red light can be used. The size and the number of the light emitting elements 22 can be suitably selected in accordance with the purpose.

The semiconductor stack includes an n-type semiconductor layer, a p-type semiconductor layer, and an emission layer interposed between the two. The emission layer may have a double heterojunction or single quantum well (SQW) structure, or one having a group of active layers such as a multiple quantum well structure.

The semiconductor stack may be structured with one or more emission layers included between the n-type semiconductor layer and the p-type semiconductor layer, or by repeating successive stacking of an n-type semiconductor layer, an emission layer, and a p-type semiconductor layer multiple times. In the case in which the semiconductor stack includes a plurality of emission layers, the emission layers may have the same peak emission wavelength or different peak emission wavelengths. The same peak emission wavelength here includes cases in which the peak emission wavelengths vary by about a few nanometers. Emission layers having different peak emission wavelengths can be suitably combined. In the case in which the semiconductor stack includes two emission layers, for example, emission layers can be selected in a combination of blue light and blue light, green light and green light, red light and red light, UV light and UV light, blue light and green light, blue light and red light, green light and red light or the like. Each emission layer may include a plurality of active layers having different peak emission wavelengths, or a plurality of active layers of the same peak emission wavelength.

The light transmissive member 23A is made of a light transmissive resin, for example, and an epoxy resin, silicone resin, a resin combining these, or the like can be used. The light transmissive member 23A may contain a phosphor, and for example, containing a phosphor which absorbs blue light from the light emitting element 22 and emits yellow light allows the light source 20 to output white light. The light transmissive member 23A may contain several kinds of phosphors, and for example, containing a phosphor which absorbs blue light from the light emitting element 22 and emits yellow light and a phosphor which absorbs blue light from the light emitting element and emits red light also allows the light source 20 to output white light. For such phosphors, for example, yttrium aluminum garnet-based phosphors (e.g., $Y_3(Al,Ga)_5O_{12}$:Ce), lutetium aluminum garnet-based phosphors (e.g., $Lu_3(Al,Ga)_5O_{12}$:Ce), terbium aluminum garnet-based phosphors (e.g., $Tb_3(Al,Ga)_5O_{12}$:Ce), CCA-based phosphors (e.g., $Ca_{10}(PO_4)_6C_{12}$:Eu), SAE-based phosphors (e.g., $Sr_4Al_{14}O_{25}$:Eu), chlorosilicate-based phosphors (e.g., $Ca_8MgSi_4O_{16}C_{12}$:Eu), β-SiAlON-based phosphors (e.g., $(Si,Al)_3(O,N)_4$:Eu), α-SiAlON-based phosphors (e.g., $Mz(Si,Al)_{12}(O,N)_{16}$:Eu ($0<z\leq2$, M is Li, Mg, Ca, Y, and lanthanide elements excluding La and Ce), SLA-based phosphors (e.g., $SrLiAl_3N_4$:Eu), nitride-based phosphors such as CASN-based phosphors (e.g., $CaAlSiN_3$:Eu) or SCASN-based phosphors (e.g., $(Sr,Ca)AlSiN_3$:Eu), fluoride-based phosphors such as KSF-based phosphors ($K_2SiF_6$:Mn), KSAF-based phosphors (e.g., $K_2(Si,Al)F_6$:Mn), or MGF-based phosphors ($3.5MgO.0.5MgF_2.GeO_2$:Mn), phosphors having a perovskite structure (e.g., $CsPb(F,Cl,Br,I)_3$), quantum dot phosphors (e.g., CdSe, InP, $AgInS_2$, or $AgInSe_2$), and the like can be used.

Alternatively, a wavelength conversion sheet containing any of these phosphors described above may be placed on the planar light source 200/300. A wavelength conversion sheet absorbs a portion of the blue light from the light source 20, and emits yellow light, green light and/or red light to produce a planar light source that outputs white light. For example, white light can be produced by combining a blue light emitting light source and a wavelength conversion sheet containing a yellow-emitting phosphor. A blue light emitting light source may be combined with a wavelength conversion sheet containing a red-emitting phosphor and a green-emitting phosphor. A blue light emitting light source may be combined with a plurality of wavelength conversion sheets. For the plurality of wavelength conversion sheets, for example, a wavelength conversion sheet containing a red-emitting phosphor and a wavelength conversion sheet containing a green-emitting phosphor can be selected. Alternatively, a light source having a blue light emitting element and a light transmissive member containing a red-emitting phosphor may be combined with a wavelength conversion sheet containing a green-emitting phosphor.

The first light adjusting member 24A is a member for adjusting the distribution of the light from the light source 20. The first light adjusting member 24A blocks or reflects a portion of the light advancing from the inside of the light source 20 to the outside through the upper face of the light source 20. The distribution of the light from the light source 20 is adjusted via the first light adjusting member 24A such that the emission immediately above it is not too intense thereby achieving uniform emission across the entire surface as the light extraction face of the planar light source 300. When the transmittance of the first light adjusting member 24A relative to the outgoing light from the light emitting element 22 is sufficiently low, for example, 1% to 50%, preferably 3% to 30%, the first light adjusting member 24A becomes a light shielding layer, preventing the luminance immediately above the light source 20 from becoming excessively high. For the first light adjusting member 24A, for example, a resin containing a light diffusing material or a metal material may be used. For the resin material, for example, a silicone resin, epoxy resin, or a resin combining these can be used. For the light diffusing material, any known material, such as titania, silica, alumina, zinc oxide, or glass can be used. For the first light adjusting member 24A, a multilayer film formed by stacking two or more dielectrics (multilayer dielectric film) can alternatively be used.

Light Guide Member

As shown in FIG. 1 and FIG. 2, a light guide member 10 is a light transmissive member for extracting the light from the light source 20 through the upper face, the light extraction face, of the planar light source 300. The lower face of the light guide member 10, except for the light source positioning part 11 where the light source 20 is positioned, faces the light reflecting sheet 40. In other words, the light reflecting sheet 40 faces across the lower face of the light guide member 10 and the lower face of the light source 20 to reduce the absorption of light by the wiring layer 32 or the like, allowing the outgoing light from the light source 20 to be effectively utilized. The height of the light guide member 10 perpendicular to the light reflecting sheet 40 is the same as or larger than the height of the light source 20, and may exceed the height of the light reflecting member 70 described later. The height of the light guide member 10 is preferably, for example, about 200 μm to about 800 μm.

The light source 20 is disposed on the lower face side of the light guide member 10 so as to expose the electrodes 21. The recessed part of the light guide member 10 in which the light source 20 is disposed is the light source positioning part 11. The light guide member 10 covers the upper face and the lateral faces of the light source 20 disposed in the light source positioning part 11.

For the material used to form the light guide member 10, a highly light transmissive material, for example, a thermoplastic resin, such as acrylic, polycarbonate, cyclic polyolefin, polyethylene terephthalate, or polyester, a thermosetting resin, such as an epoxy or silicone resin, or glass can be used. Particularly, highly light transmissive and inexpensive polycarbonate is preferably used.

The upper face of the light guide member 10 may have protrusions and/or indentations in a low luminance region, for example, in order to reduce luminance nonuniformity.

Light Reflecting Sheet

A light reflecting sheet 40 is a sheet-shaped member that reflects light towards the light extraction face of the planar light source 300. The light reflecting sheet 40 is interposed between the light guide member 10 and the wiring substrate 30 described later, and has first through holes 41 facing the electrodes 21 on a one-to-one basis.

The opening of a first through hole 41 large enough to contain an electrode 21 in whole therein can facilitate the electrical connection between the electrode 21 and the conducting member 50 described later. However, the larger the opening of a first through hole 41, the smaller the light reflecting sheet 40 in the location that faces the light source 20 becomes. This would increase the area of the wiring layer 32 or the like irradiated by the light from the light source 20 via the first through holes 41. Irradiation of light against the wiring layer 32 or the like would increase the chances of light absorption. Accordingly, it is preferable to substantially match the shape of the opening of a first through hole 41 to the shape of an electrode 21 or make the opening of the first through hole 41 small to be positioned inward of the outline of the electrode in a plan view. It is preferable for the opening of a first through hole 41 not to run over the outline of the light source 20 in a plan view. In other words, the opening of a first through hole 41 is preferably positioned inward of the outline of the light source 20 in a plan view. This can reduce the absorption of the light from the light source 20 by the conducting members 50 disposed in the first through holes 41.

The light reflecting sheet 40 preferably has a high reflectance for the effective utilization of light. The reflectance of the light reflecting sheet 40 relative to the wavelengths of the light emitted by the light source 20 is preferably at least 90%, for example, more preferably at least 94%.

For the light reflecting sheet 40, a resin sheet containing a large number of air bubbles (e.g., foamed resin sheet), resin sheet containing a light diffusion material, or the like can be used. Examples of resins for use as the light reflecting sheet 40 include thermoplastic resins, such as acrylic resins, polycarbonate resins, cyclic polyolefin resins, polyethylene terephthalate resins, polyethylene naphthalate resins, and polyester resins, and thermosetting resins, such as epoxy resins, and silicone resins. For the light diffusing material, any known material, such as, titania, silica, alumina, zinc oxide, or glass can be used.

Second Light Adjusting Member

The planar light source 300 includes a light adjusting member (second light adjusting member) 60 disposed on the light guide member 10 so as to oppose the light source 20 via the light guide member 10.

The second light adjusting member 60 is a member for reducing the intensity of light directly above the light source 20 in the light extraction face of the planar light source 300 to bring the luminance of the light extraction face close to uniformity. The transmittance of such a second light adjusting member 60 relative to the light from the light source 20 is preferably 20% to 60%, for example, more preferably 30% to 40%. For the second light adjusting member 60, similar to the first light adjusting member 24A, a light reflecting material, such as resin material containing a light diffusing material or a metal material can be used. The second light adjusting member 60 in this embodiment covers the entire light source 20 and has a plan view outline of a circular shape, which can alternatively be a quadrilateral shape. The second light adjusting member 60 is in the form of a layer in this embodiment, but can be in the form of dots.

Light Reflecting Member

The planar light source 300 includes a light reflecting member 70 which surrounds a light source 20 in the form of a quadrilateral frame at a distance from the light source 20 in a plan view.

The light reflecting member 70 is a member for reflecting the light from the light source 20 towards the light extraction face of the planar light source 300 to be extracted. The light reflecting member 70 has a prescribed height, and is disposed on the light reflecting sheet 40 along the perimeter of the light guide member 10. Allowing the light reflecting members 70 to section the light guide member 10 per light source 20 can reduce light that is guided between adjacent sections. This enables local dimming in which the emission region is controlled section by section.

The height of the light reflecting member 70 in the direction perpendicular to the light reflecting sheet 40 is preferably the same as or larger than the height of the light source 20. In a plan view, the length of a side of the light reflecting member 70 which is a quadrilateral frame is larger than the length of a side of the light source 20, for example, in the range of five to thirty times the length of a side of the light source 20.

The inner lateral faces of the light reflecting member 70 in this embodiment are curved outward towards the light source 20, but may be curved inward. It is particularly preferable for the cross-sectional shape of the light reflecting member 70 to be such that the width narrows as it becomes more distant from the light reflecting sheet 40 in the direction of height. This can effectively extract the light from the light source 20 through the light extraction face of the planar light source 300. Each inner lateral face of the light reflecting member 70 may be a single flat face, a single curved face, a combination of flat faces having different oblique angles to the light reflecting sheet 40, a combination of curved faces having different curvatures, or a combination of a flat face and a curved face.

The reflectance of the light reflecting member 70 for the light from the light source 20 is preferably at least 60%, for example, more preferably at least 90%. For the resin used to form the light reflecting member 70, for example, a thermoplastic resin such as acrylic, polycarbonate, cyclic polyolefin, polyethylene terephthalate, or polyester resin, and a thermosetting resin, such as an epoxy or silicone resin can be used. For the light diffusing material, any known material, such as Mania, silica, alumina, zinc oxide, or glass can be used.

Wiring Substrate

A wiring substrate 30 includes an insulating base 34, a wiring layer 32 disposed on the insulating base 34 to which a pair of positive and negative electrodes 21 are electrically connected, and a cover layer 36 covering the wiring layer 32. The wiring substrate 30 has third through holes 31 that pass through the wiring layer 32 and communicate with the first through holes 41 on a one-to-one basis.

For the wiring substrate 30, for example, a rigid substrate or flexible substrate can be used.

The wiring substrate 30 has a first face which is the face no light source 20 is disposed, and a second face located opposite the first face.

Figure 4:
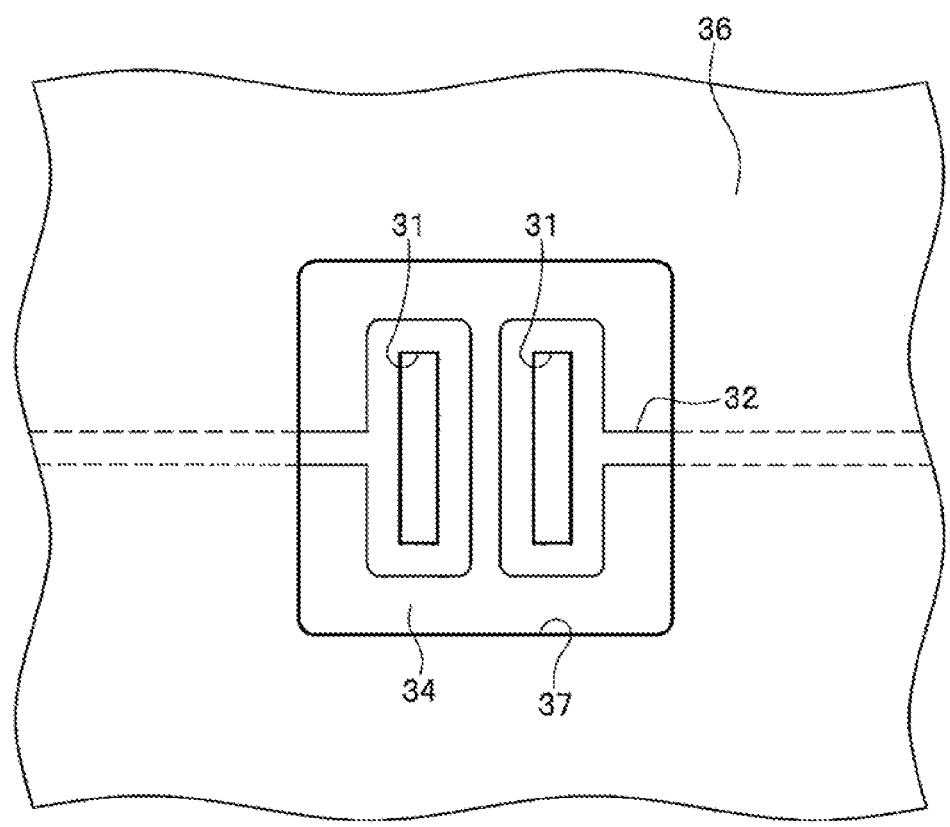
FIG. 4 is a schematic plan view of the opening in the cover layer of the wiring substrate according to the first embodiment.
Figure 5:
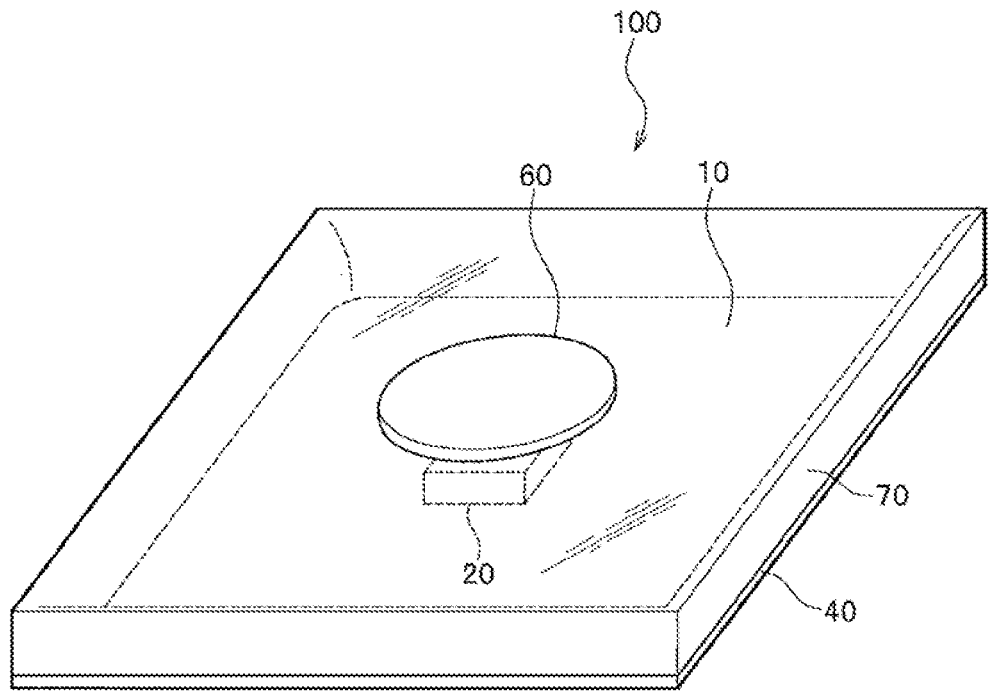
FIG. 5 is a schematic perspective view of a light emitting module according to the first embodiment.

The wiring layer 32 is a member that serves as a voltage application path for the light source 20. The wiring layer 32 can be shaped such that the width is larger at the portions where the third through holes 31 are formed than the other linear portions, as shown in FIG. 4 by way of example.

A metal material can be used as the wiring layer 32. For example, a metal such as Ag, Al, Ni, Rh, Au, Cu, Ti, Pt, Pd, Mo, Cr, W, or the like, an alloy of these metals, or conductive paste containing any of these metals, alloys, or metal powder can suitably be used. As for the metal powder particle shape, for example, spherical, flake-shaped, or needle-shaped particles can be used.

The wiring layer 32 is disposed on the insulating base 34.

Examples of the material for use as the insulating base 34 include insulating resin materials, such as phenol, epoxy, polyimide, BT, polyphthalamide, or the like. The insulating base 34 may be made by using a ceramic material, such as alumina, aluminum nitride, or the like. The insulating base 34 may be one in which an insulating layer is disposed on the surface of a metal member.

A cover layer 36 is a member that protects the wiring layer 32. The cover layer 36 may be disposed to cover the entire insulating base 34. In the first embodiment, the cover member 36, as shown in FIG. 4, has an opening 37 so as to expose the third through holes 31 and the wiring layer 32 around the third through holes. An insulating material, for example, polyimide is used as the cover layer 36.

Conducting Member

A conducting member 50 is a member that electrically connects each electrode 21 and the wiring layer 32.

As described earlier, the light reflecting sheet 40 is provided with the first through holes 41 facing the pair of positive and negative electrodes 21 of the light source 20 on a one-to-one basis, and the wiring substrate 30 is provided with the third through holes 31 individually communicating with the first through holes 41. In other words, paths from the electrodes 21 to the wiring layer 32 are present between the electrodes 21 and the wiring layer 32 on a one-on-one basis. A conducting member 50 is disposed in each of the paths to electrically connect an electrode 21 and the wiring layer 32.

For the material used to form the conducting members 50, in addition to the materials similar to those for use as the wiring layer 32, any known material, such as tin-silver-copper (SAC)-based or tin-bismuth (SnBi)-based solder or the like can be used.

In the planar light source 300, the electrical contact between the wiring layer 32 and the conducting members 50 is established on the inside of the third through holes 31 and on the face of the wiring layer 32 opposite the face which has the light reflecting sheet 40. Here, the face of the wiring layer 32 opposite the face which has the light reflecting sheet 40 is the first face of the wiring substrate 30. On the first face of the wiring substrate 30, as shown in FIG. 4 for example, the third through holes 31 are provided in the locations overlapping the wiring layer 32 in a plan view. In other words, the third through holes 31 are positioned inward of the outer edges of the wiring layer 32. The electrical contact between the wiring layer 32 and the conducting members 50 is established at the exposed portions of the wiring layer 32 in the inner lateral faces of the third through holes 31 (inner lateral faces of the through holes of the wiring layer 32) and at the wiring layer 32 around the third through holes 31 to thereby securely establish an electrical connection. The inner lateral faces of the third through holes 31 in this embodiment are flush with the inner lateral faces of the through holes of the wiring layer 32 and the through holes of the insulating base 34, but the inner lateral faces of the through holes of the wiring layer 32 may be positioned outward from the inner lateral faces of the through holes of the insulating base 34. In other words, in a plan view, the width of a through hole of the wiring layer 32 may be larger than the width of a through hole of the insulating base 34. Furthermore, the wiring layer 32, in a plan view, may be provided to surround the entire periphery of a through hole of the insulating base 34 as in the case of this embodiment, but it may be disposed in one portion of the periphery of a through hole of the insulating base 34.

Protective Member

The planar light source 300 may include a protective member 80 that covers the opening 37 of the cover layer 36 of the wiring substrate 30 in addition to the components described above. The protective member 80 is a member having insulating properties for providing short circuit protection for the wiring layer 32 and the conducting members 50.

For the protective member 80, phenyl silicone resins, dimethyl silicone resins, epoxy resins, acrylic resins, or urethane resins can be used. The protective member 80 may have light transmitting properties, or may be made to be non-light transmissive by containing a pigment such as titanium oxide. A protective member 80 with light transmitting properties is particularly preferable because it makes the connection condition between the wiring layer 32 and the conducting members 50 visible.

According to the planar light source 300 having the constituent elements described above, the conducting members 50 are connected to the electrodes 21 via the first through holes 41 provided in the light reflecting sheet 40 to face the pair of positive and negative electrodes 21 of a light source 20 on a one-to-one basis. Accordingly, in the planar light source 300, the entire lower face of a light source 20, excluding the electrodes 21, faces the light reflecting sheet 40 to thereby allow the light from the light source 20 to be effectively utilized. Because a pair of positive and negative electrodes 21 are spaced apart, as shown in FIG. 3C, a region 25 is present in the lower face of a light source 20 between the pair of positive and negative electrodes 21 of the light source 20, regardless of the shapes or the locations of the electrodes 21. Because the region 25 also faces the light reflecting sheet 40, the light from the light source 20 can be more effectively utilized. Accordingly, the planar light source 300 can increase the area of the light reflecting sheet 40 facing a light source 20, while reducing the area of the wiring layer 32 or the like irradiated by light. The planar light source 300 can hinder the wiring layer 32 or the like from absorbing light, thereby effectively utilizing the light from the light source 20.

A single or multiple light sources 20 may be disposed on the wiring substrate 30. The number of light sources 20 can be suitably selected in accordance with the size and the shape of the planar light source 300. Furthermore, the space between the light sources 20 can be suitably adjusted.

Method of Manufacturing Planar Light Source According to First Embodiment

A method of manufacturing a planar light source 300 according to the first embodiment by way of example will be explained next with reference to FIG. 1 to FIG. 9C and FIG. 22.

A method of manufacturing a planar light source 300 includes: a light emitting module preparation process S1 which prepares a light emitting module 100 having a light source 20 with a pair of positive and negative electrodes 21 on one face, a light guide member 10 covering the light source 20 so as to expose the electrodes 21, and a light reflecting sheet 40 having first through holes 41 facing the positive and negative electrodes of the light source 20 on a one-to-one basis; a wiring substrate preparation process S2 which prepares a wiring substrate 30 having a wiring layer 32 to which the electrodes 21 will be electrically connected; a light emitting module bonding process S3 which bonds the light emitting module 100 to the wiring substrate 30; and a connection process S4 which electrically connects the electrodes 21 and the wiring layer 32 via the conducting members 50 disposed in the first through holes 41. Here, either the light emitting module preparation process S1 or the wiring substrate preparation process S2 can be performed first, or both can be performed simultaneously.

Light Emitting Module Preparation Process

A light emitting module preparation process S1 is a process of preparing a light emitting module 100 equipped with at least a light source 20, a light guide member 10, and a first light reflecting sheet 40. A planar light source 300 is constructed in a process in the manufacturing method which combines a wiring substrate 30 and a light emitting module 100 such as that shown in FIG. 5, or a unit of orderly arranged light emitting modules 100. The light emitting module 100 according to this embodiment further includes a light reflecting member 70 and a light adjusting member (second light adjusting member) 60.

Here, the case in which a plurality of light emitting modules 100 are formed by producing a block of light emitting modules 100 that will be subsequently divided into units will be explained. Here, dividing the block into units includes, in addition to the case of separating the block into units each having a light source 20, cases of separating the block into units each having two or more light sources 20. The separated light emitting modules can be bonded to a wiring substrate 30 in the light emitting module bonding process described later.

Figure 7A:
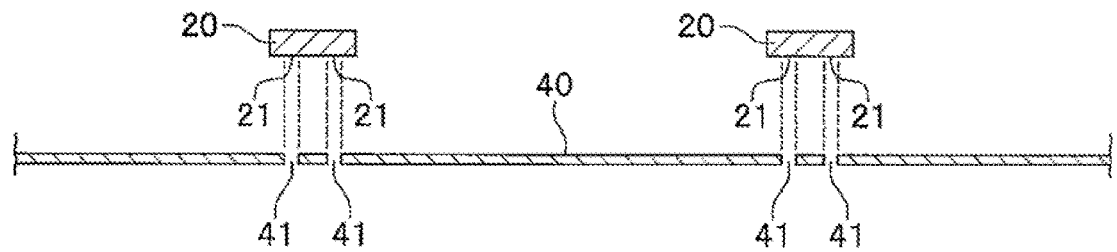
FIG. 7A is a schematic cross-sectional view illustrating a manufacturing method according to the first embodiment.

First, as shown in FIG. 7A, a first light reflecting sheet 40 is formed by forming first through holes 41 such that one first through hole 41 correspond with one electrode 21 of the light sources 20. In other words, in this example, two through holes 41 are created per light source 20. The first through holes 41 can be created by punching, for example, using a punch having a hole that substantially matches the shape of an electrode 21 in a plan view. Besides punching, the first through holes 41 can alternatively be created, for example, by drilling or using a laser. Alternatively, a light reflecting sheet which already has first through holes 41 can be purchased.

Figure 7B:
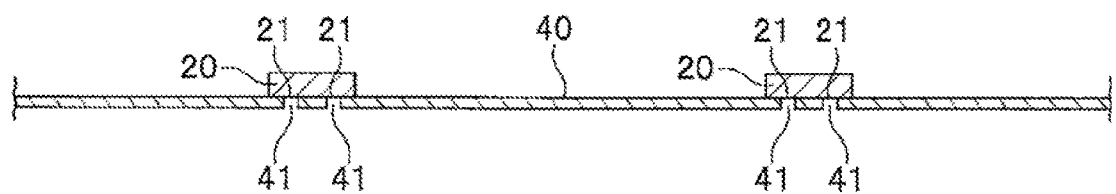
FIG. 7B is a schematic cross-sectional view illustrating the manufacturing method according to the first embodiment.

Next, as shown in FIG. 7B, light sources 20 are arranged on the first light reflecting sheet 40 so as to align the first through holes 41 with the electrodes 21 to face one another. The region 25 between a pair of positive and negative electrodes 21 in the face of a light source 20 having the electrodes 21 opposes the first light reflecting sheet 40.

Figure 6:
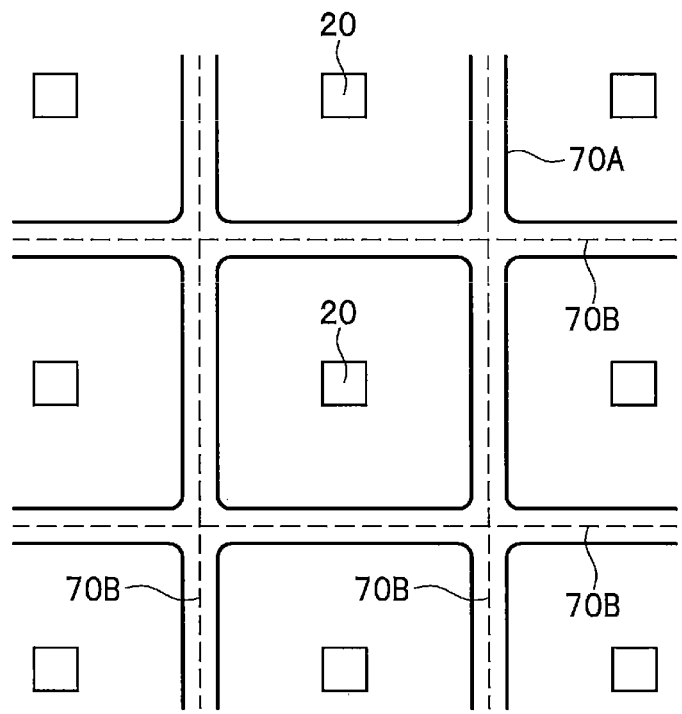
FIG. 6 is a schematic plan view showing the relative positions of the light sources and the light reflecting members according to the first embodiment.
Figure 7C:
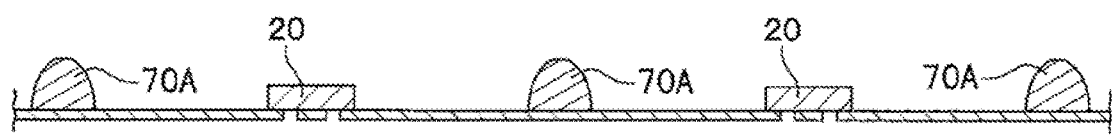
FIG. 7C is a schematic cross-sectional view illustrating the manufacturing method according to the first embodiment.

Then as shown in FIG. 7C, a light reflecting member 70A is disposed to surround each light source 20 at a certain distance from the light source. The light reflecting member 70A, as shown in FIG. 6, is formed in a grid pattern in a plan view. Each grid square within the grid-patterned light reflecting member 70A surrounds a light source 20 located in the center. The light reflecting member 70A, for example, is formed by applying on the first light reflecting sheet 40 a material employed to form the light reflecting member 70A in the state of having an adequate viscosity. A cross section of the light reflecting member 70A is a shape similar to a halved ellipse cut along the short diameter shown as an example, but may be triangular or quadrilateral, for example.

Figure 7D:
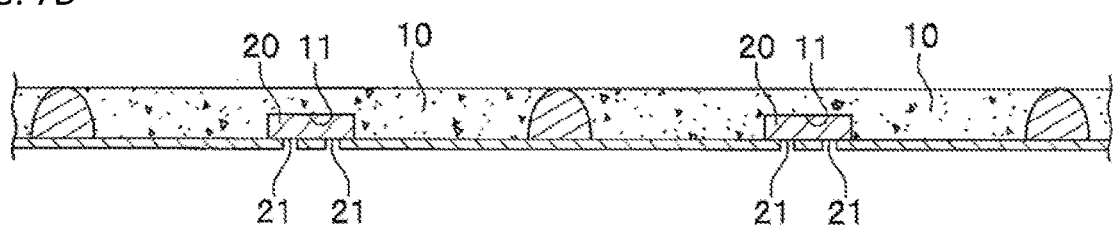
FIG. 7D is a schematic cross-sectional view illustrating the manufacturing method according to the first embodiment.

Next, as shown in FIG. 7D, a light guide member 10 is disposed to cover each light source 20. The light guide members 10 can be disposed, for example, by injecting a resin employed to form the light guide members 10 into the spaces surrounded by the frames constructed by the light reflecting member 70A and hardening the resin. The resin can be injected through a nozzle of a dispenser, applied by screen printing, spray coating, or in combination of these. The positions where the light sources 20 are prearranged become the light source positioning parts 11 in the light guide members 10 as a result in this manufacturing method. Because the lower faces of the light sources 20 are not covered by the light guide members 10, the electrodes 21 oppose the first through holes 41 of the first light reflecting sheet 40 in the state of being exposed from the light guide members 10. The entire lower face of each light source 20, excluding for the electrodes 21, faces the first light reflecting sheet 40 to thereby allow the light from the light sources 20 to be effectively utilized. The light guide members 10 can alternatively be prepared by injection molding or transfer molding, or through a purchase of formed parts.

Figure 7E:
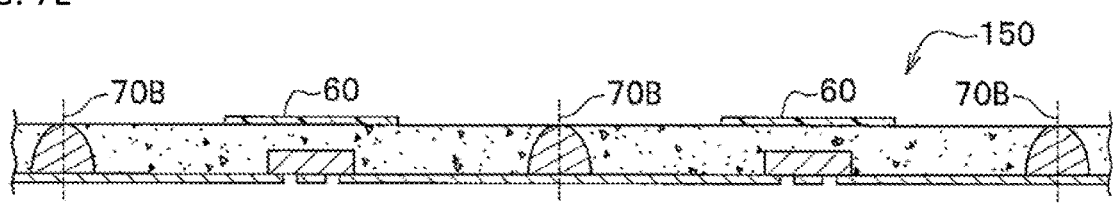
FIG. 7E is a schematic cross-sectional view illustrating the manufacturing method according to the first embodiment.

Next, as shown in FIG. 7E, light adjusting members 60 are disposed on the light guide members 10 so as to oppose the light sources 20 via the light guide members 10. The light adjusting members 60 can be formed, for example, by applying a resin material for the light adjusting members 60 on the light guide members 10 and hardening the resin. At this stage, a block 150 of light emitting modules 100 not yet divided is completed.

Figure 7F:
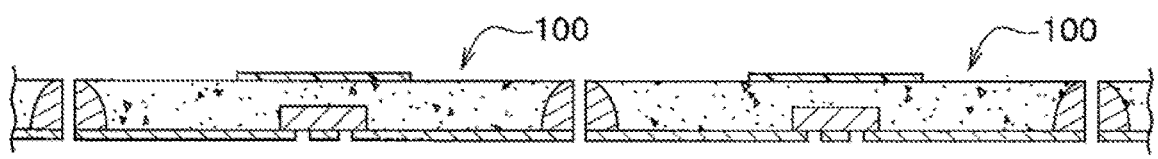
FIG. 7F is a schematic cross-sectional view illustrating the manufacturing method according to the first embodiment.

As shown in FIG. 7F, the block 150 of the light emitting modules 100 is cut along the grid lines 70B in the light reflecting member 70 into individual modules. The cutting can be accomplished by any known method which uses a dicing blade or laser, for example. In this manner, a plurality of light emitting modules 100 can be produced.

Wiring Substrate Preparation Process

Figure 8A:
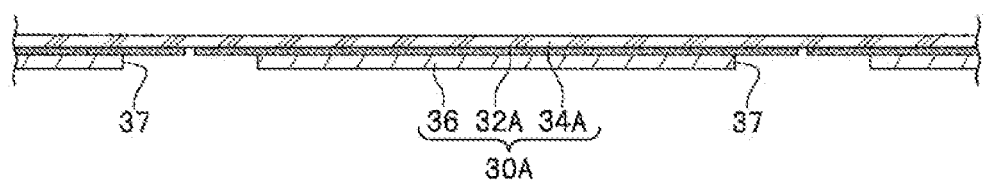
FIG. 8A is a schematic cross-sectional view illustrating the manufacturing method according to the first embodiment.
Figure 8B:
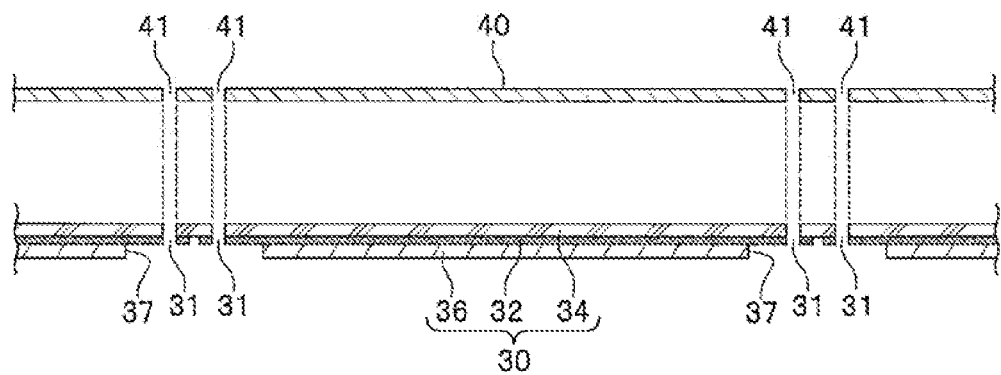
FIG. 8B is a schematic cross-sectional view illustrating the manufacturing method according to the first embodiment.

A wiring substrate preparation process S2 is a process of preparing a wiring substrate 30 for bonding a light emitting module 100. Here, the wiring substrate 30 is provided with third through holes 31 passing through the wiring layer 32 and communicating with the first through holes 41 on a one-to-one basis. FIG. 8A is a cross-sectional view of a wiring substrate 30A before creating third through holes 31. FIG. 8B is a cross-sectional view of the wiring substrate 30 after creating third through holes 31.

First, a wiring substrate 30A is formed by disposing a wiring layer 32A on an insulating base 34A, and disposing a cover layer 36 to cover the wiring layer 32A. In the cover layer 36, openings 37 are created for disposing conducting members 50 in a subsequent process. For example, an opening 37 is provided to expose the area for subsequently creating third through holes 31 and the surrounding area as shown in FIG. 4.

Next, in the wiring substrate 30A not yet provided with third through holes 31, third through holes 31 are created through the wiring layer 32 to communicate with the first through holes 41 on a one-to-one basis. The third through holes 31 can be created by, for example, punching, drilling, or laser processing. For the wiring substrate preparation process S2, a wiring substrate having a wiring layer, a cover layer formed and third through holes 31 as described above can be purchased.

Light Emitting Module Bonding Process

A light emitting module bonding process S3 is a process of bonding a wiring substrate 30 and a light emitting module 100.

Figure 9A:
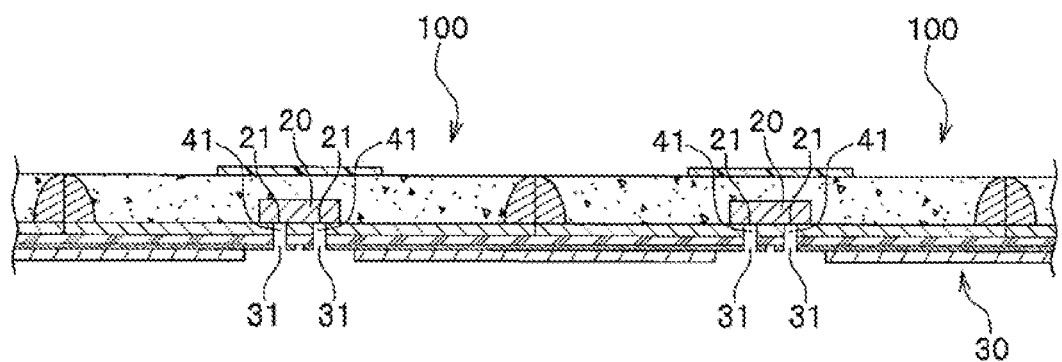
FIG. 9A is a schematic cross-sectional view illustrating the manufacturing method according to the first embodiment.

As shown in FIG. 9A, after applying a bonding resin to the surface of the wiring substrate 30 on which light emitting modules 100 will be bonded, light emitting modules 100 are positioned while aligning the first through holes 41 with the third through holes 31 and bonded. The bonding resin is not shown in the drawing. For example, any known bonding resin having as a component an acrylic, epoxy, or urethane resin can be used. In FIG. 9A, adjacent light emitting modules 100 are contacting one another. However, the space between light emitting modules 100 can be suitably set, such as about 1% to about 10% of the width of a light emitting module 100.

The wiring substrate 30 with light emitting modules 100 adhered thereto, when viewed from the face which does not have the light emitting modules 100 have the third through holes 31 communicating with the first through holes 41 of the first light reflecting sheet 40, and the far ends of the first through holes 41 are closed by the electrodes 21 of the light sources 20. In other words, as many holes as the electrodes 21, each having a third through hole 31 as the inlet and an electrode 21 as the bottom, are created.

Connection Process

Figure 9B:
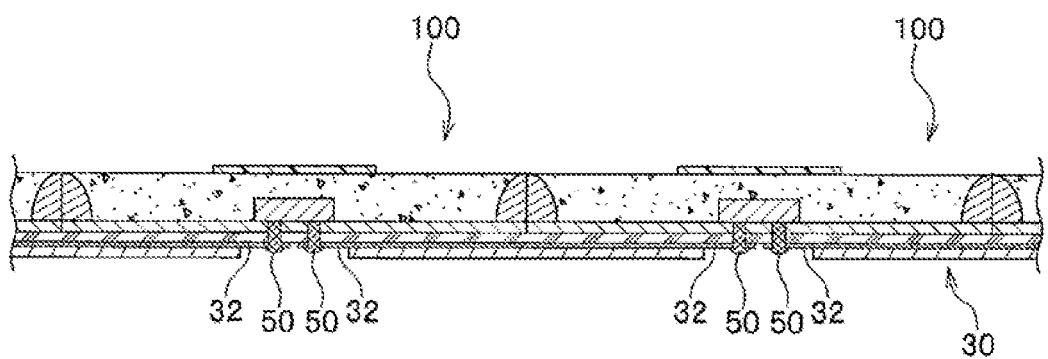
FIG. 9B is a schematic cross-sectional view illustrating the manufacturing method according to the first embodiment.

A connection process S4 is a process of electrically connecting the electrodes 21 and the wiring layer 32 by using conducting members 50. FIG. 9B is a cross section after completing the connection process S4.

First, a material for forming the conducting members 50 is injected into the holes from the inlets, the third through holes 31. When injecting the conducting members 50, the wiring substrate 30 with the light emitting modules 100 adhered thereto is laid horizontally, the light emitting module 100 side down. The amount of the material for forming the conducting members 50 needs to be sufficient to allow the material to fully reach the electrodes 21, the bottoms of the holes, while securing electrical contact with the wiring layer 32 within the third holes 31. For the conducting members 50, furthermore, the amount sufficient to allow the material to spread onto the surface of the wiring layer 32 around the third through holes 31 is injected. In other words, electrical contact between the conducting members 50 and the wiring layer 32 is also provided on the face of the wiring layer 32 opposite the face having the first light reflecting sheet 40, which more securely provides electrical connection between the conducting members 50 and the wiring layer 32.

After injecting the conducting members 50, a process of heating the conducting members 50 (e.g., reflow treatment) is performed. The conducting members 50 may be disposed separately per hole as in the case of this embodiment, or disposed to connect adjacent holes to be subsequently separated per hole by using a laser or the like before or after heating the conducting members 50. The material for the conducting members 50 may be injected using a nozzle of a dispenser, applied by screen printing, or by a combination of screen printing and nozzle injection, for example, injecting through a nozzle followed by screen printing.

Protective Member Forming Process

Figure 9C:
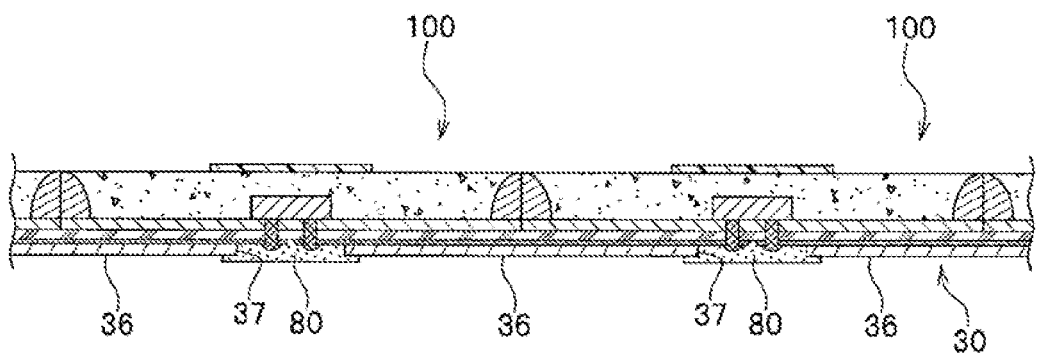
FIG. 9C is a schematic cross-sectional view illustrating the manufacturing method according to the first embodiment.

In addition to the processes described above, a protective member forming step S5 may further be performed. The protective member forming process S5 is a process of forming protective members 80 that cover the conducting members 50 and the exposed wiring layer 32. As shown in FIG. 9C, in the protective member forming process S5, the protective members 80 are formed to also cover the cover layer 36 around the openings 37.

As explained above, separately preparing the light emitting modules 100 and the wiring substrate 30 allows each process to progress simultaneously or independently, thereby improving manufacturing efficiency. In this manufacturing method, a light emitting module 100 or a unit of orderly arranged light emitting modules 100 is bonded to a wiring substrate 30. This makes it easy to adjust the spacing and the number of light emitting modules 100.

Second Embodiment

Figure 10:
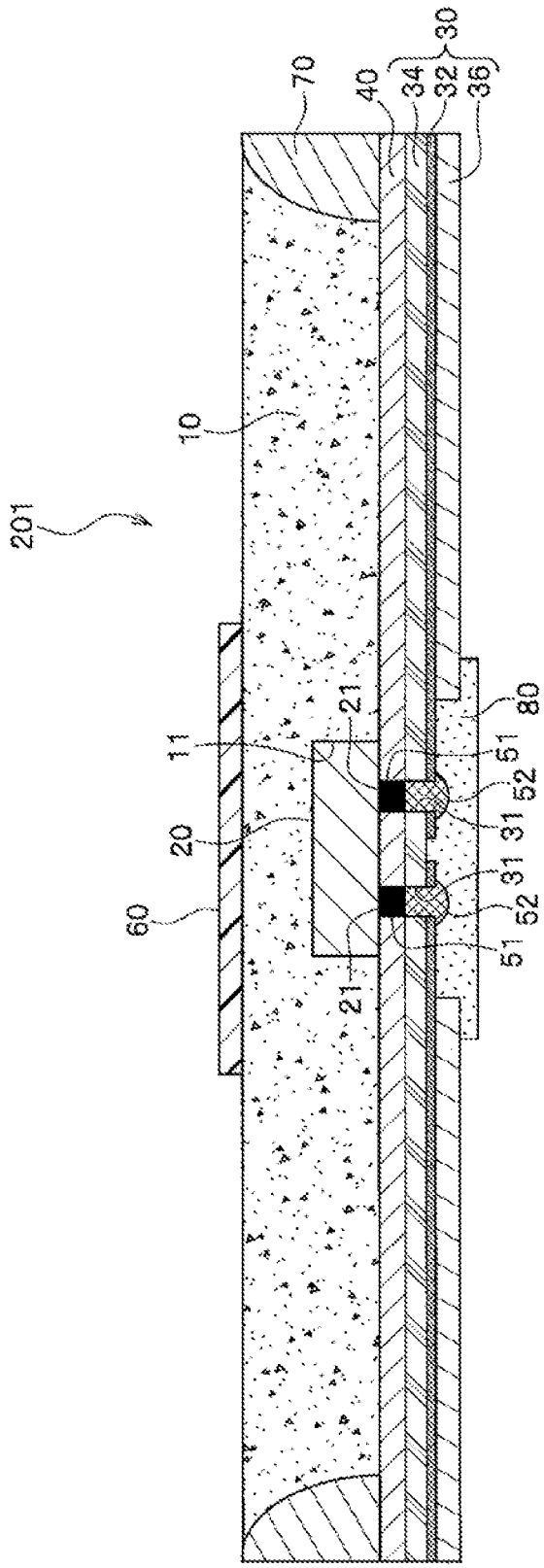
FIG. 10 is a schematic cross-sectional view of a portion of a planar light source according to a second embodiment.

The structure of a planar light source according to a second embodiment as a planar light source 201 having one light emitting module will be explained with reference to FIG. 10.

The planar light source 201 differs from the planar light source 200 according to the first embodiment in terms of the construction of a conducting member. The other constituent elements are in common with the first embodiment. Explanation of the common features will be omitted as appropriate.

First Conducting Member and Second Conducting Member

The conducting members of the planar light source 201 each include a first conducting member 51 disposed in a first through hole 41 and a second conducting member 52 disposed between the first conducting member 51 and the wiring layer 32. The electrodes 21 and the wiring layer 32 are electrically connected via the first conducting members 51 and the second conducting members 52.

The first conducting members 51 may be disposed in the first through holes 41 so as to be flush with or lower than the surface of the light reflecting sheet 40, or protrude from the first through holes 41. For the materials for forming the first conducting members 51 and the second conducting members 52, one similar to the material used for the conducting members 50 in the first embodiment can be used. The materials for forming the first conducting members 51 and the second conducting member 52 may be the same or different.

In the planar light source 201, the entire lower face of the light source 20, excluding the electrodes 21, faces the light reflecting sheet 40 to thereby allow the light from the light source 20 to be effectively utilized. The shape of each first conducting member 51 on the light source 20 side can be adjusted in correspondence with the shape of each electrode 21. For the first conducting members 51, a material suited for bonding with the electrodes 21 can be selected.

Method of Manufacturing Planar Light Source According to Second Embodiment

An example of method of manufacturing a planar light source according to the second embodiment will be explained with reference to FIG. 11A to FIG. 12B and FIG. 22. The drawings show an example in which multiple light emitting modules and a wiring substrate are combined.

In the method of manufacturing a planar light source according to the second embodiment, the light emitting module preparation process S12 and the connection process S42 differ from the method of manufacturing a planar light source according to the first embodiment explained earlier. The rest is in common with the manufacturing method according to the first embodiment.

Connection Process

In the connection process S42 in the method of manufacturing a planar light source according to the second embodiment, the electrodes 21 and the wiring layer 32 are electrically connected via the conducting members that are preliminarily disposed in the first through holes 41 of the first light reflecting sheet 40. The conducting members preliminarily disposed in the first through holes 41 are the first conducting members 51, and the conducting members disposed between the first conducting members 51 and the wiring layer 32 are the second conducting members 52.

Figure 11A:
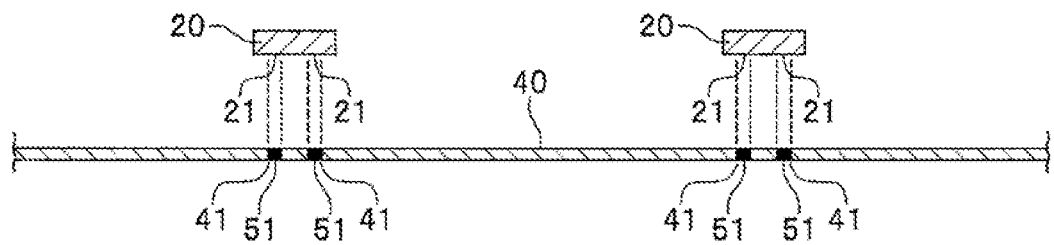
FIG. 11A is a schematic cross-sectional view illustrating a manufacturing method according to the second embodiment.
Figure 11B:
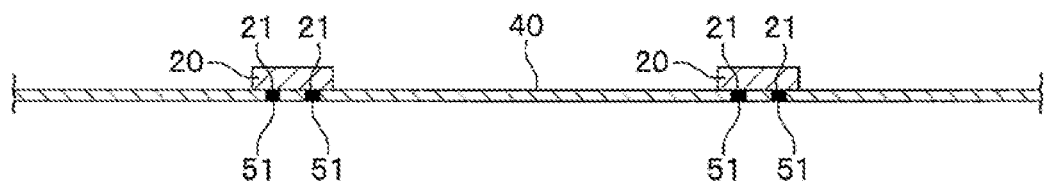
FIG. 11B is a schematic cross-sectional view illustrating the manufacturing method according to the second embodiment.
Figure 12A:
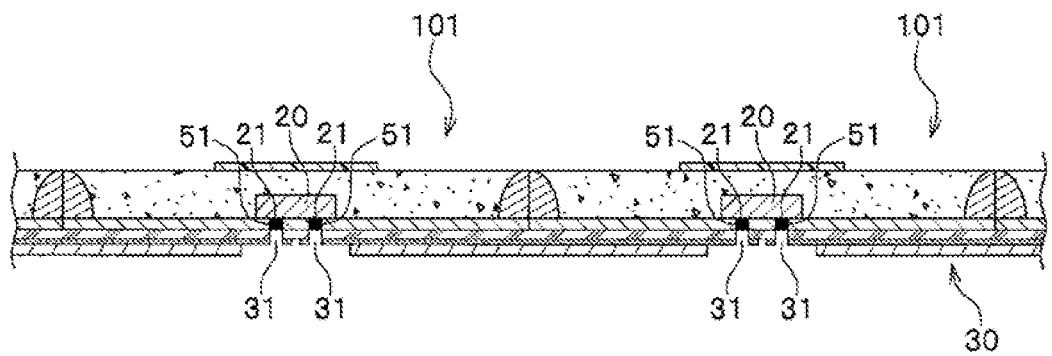
FIG. 12A is a schematic cross-sectional view illustrating the manufacturing method according to the second embodiment.
Figure 12B:
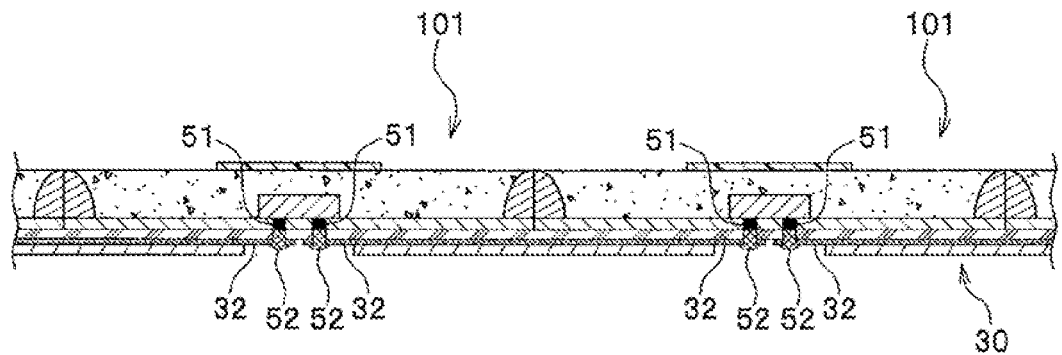
FIG. 12B is a schematic cross-sectional view illustrating the manufacturing method according to the second embodiment.

The process of disposing the first conducting members 51 is performed in the light emitting module preparation process S12. The first conducting members 51, as shown in FIG. 11A and FIG. 11B, are already disposed in the first through holes 41 of the first light reflecting sheet 40 before disposing light sources 20. The first conducting members 51 and the electrodes 21 of the light sources 20 are bonded by using solder or the like. The process of disposing second conducting members 52, as shown in FIG. 12A and FIG. 12B, is performed after bonding the light emitting modules 101 to the wiring substrate 30. The light emitting module preparation process S12 is similar to the light emitting module preparation process S1 of the first embodiment except for disposing the first conducting members 51.

In the manufacturing method of the second embodiment, preliminarily disposing conducting members in the first through holes 41 allows the other processes to progress in a similar manner to in the first embodiment. Accordingly, this manufacturing method can form a planar light source according to the second embodiment while making the best use of the manufacturing method of the first embodiment.

Third Embodiment

Figure 13:
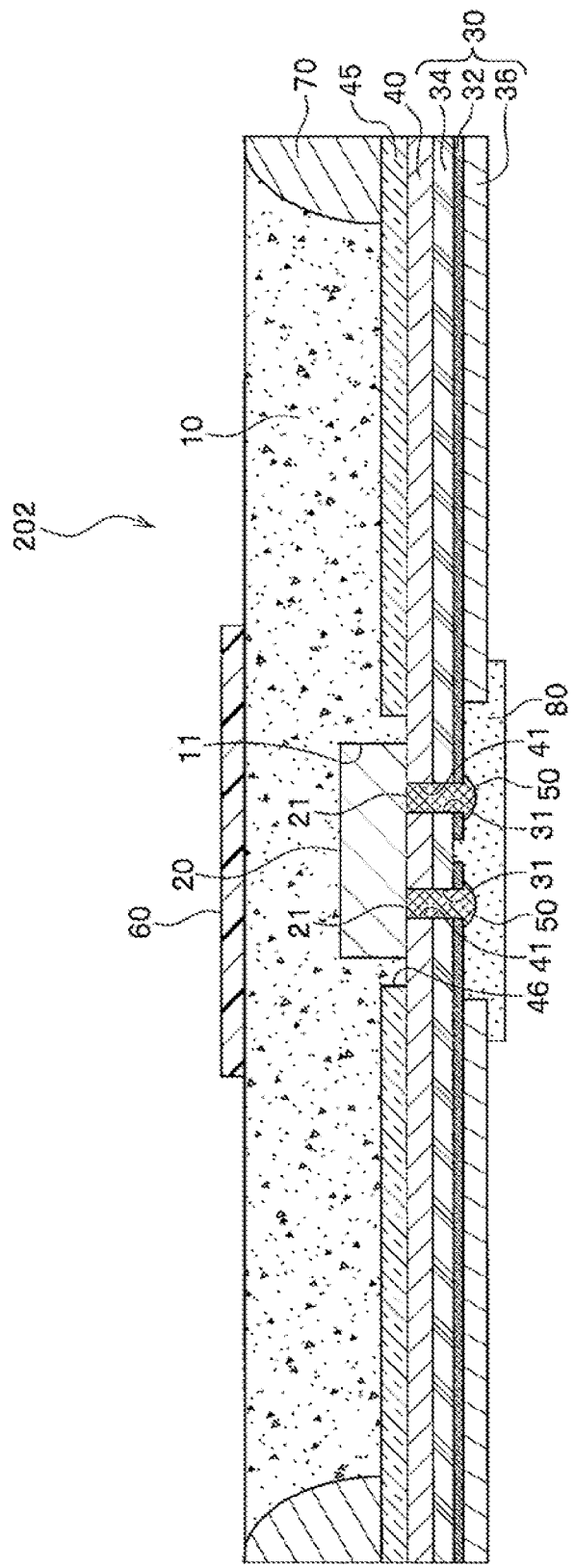
FIG. 13 is a schematic cross-sectional view of a portion of a planar light source according to a third embodiment.
Figure 14:
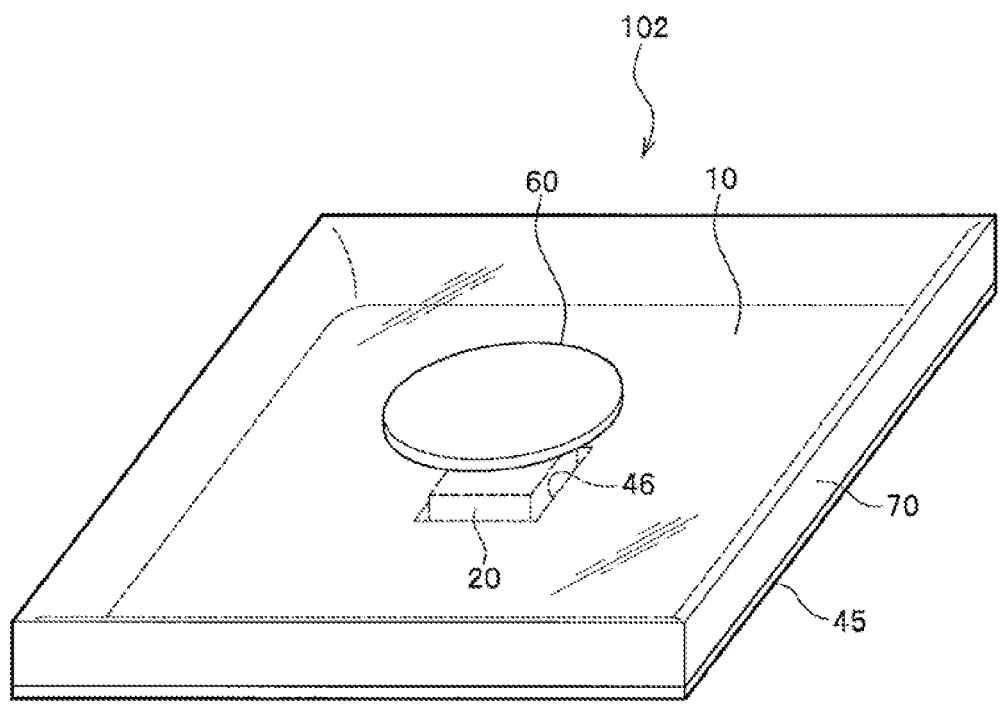
FIG. 14 is a schematic perspective view of a light emitting module according to the third embodiment.

One example of the structure of a planar light source according to a third embodiment as a planar light source 202 having one light emitting module will be explained with reference to FIG. 13.

The planar light source 202 differs from the planar light source 200 according to the first embodiment in terms of the construction of the light reflecting sheet. The other constituent elements are in common with the first embodiment. Explanation of the common features will be omitted as appropriate.

First Light Reflecting Sheet and Second Light Reflecting Sheet

The light reflecting sheets of the planar light source 202 include a first light reflecting sheet 40 having first through holes 41 and a second light reflecting sheet 45 having a second through hole 46 that faces the first through holes 41 and is for disposing a light source 20. In other words, the second through hole 46 is arranged at a position overlapping the first through holes 41 in the plan view, and the light source 20 is disposed in the second through hole in the plan view.

In the planar light source 202, similar to the planar light source 200 according to the first embodiment, the entire lower face of the light source 20, excluding the electrodes 21, faces the first light reflecting sheet 40 to thereby allow the light from the light sources 20 to be effectively utilized. Furthermore, the planar light source 202 in which the region 25 of the light source 20 between the electrodes 21 faces the first light reflecting sheet 40 can reduce the area of the wiring layer 32 or the like irradiated by light. In the planar light source 202, in the surrounding of the light source 20, the first light reflecting sheet 40 and the second light reflecting sheet 45 are arranged in a stack. The stack of light reflecting sheets can further reduce the irradiation of light against the wiring layer 32 or the like.

Method of Manufacturing Planar Light Source According to Third Embodiment

One example of method of manufacturing a planar light source according to the third embodiment will be explained with reference to FIG. 14 to FIG. 17C and FIG. 22. The drawings show an example in which multiple light emitting modules and a wiring substrate are combined.

The method of manufacturing a planar light source according to the third embodiment includes: a wiring substrate preparation process S2A which disposes, on a wiring substrate 30 having a wiring layer 32 to which a pair of positive and negative electrodes 21 of a light source 20 will be electrically connected, a first light reflecting sheet having first through holes that will face the positive and negative electrodes 21 of the light source 20 on a one-to-one basis while opposing the wiring layer 32 to the first through holes 41; a light emitting module preparation process S1A which prepares a light emitting module 102 including the light source 20, a second light reflecting sheet 45 having a second through hole 46 that faces the first through holes 41 and is for housing the light source 20, and a light guide member 10 covering the light source 20 so as to expose the electrodes 21, wherein the light source 20 is disposed in the second through hole 46 and in the light guide member 10; a light emitting module bonding process S3A which bonds the light emitting module 102 to the wiring substrate 30 while interposing the first light reflecting sheet 40 such that the electrodes 21 face the first through holes 41; and a connection process S4 which electrically connects the electrodes 21 and the wiring layer 32 via the conducting members 50 disposed in the first through holes 41. Here, either the light emitting module preparation process S1A or the wiring substrate preparation process S2A can be performed first, or they can be performed simultaneously.

Light Emitting Module Preparation Process

A light emitting module preparation process S1A is a process of preparing a light emitting module 102 which includes at least a light source 20, a light guide member 10, and a second light reflecting sheet 45. A planar light source 202 is constructed in a process in the manufacturing method by combining a light emitting module 102 such as that shown in FIG. 14, or a unit of orderly arranged light emitting modules 102, with a first light reflecting sheet 40 and a wiring substrate 30. The light emitting module 102 in this embodiment further includes a light reflecting member 70 and a light adjusting member (second light adjusting member) 60.

Here, the case in which a plurality of light emitting modules are prepared by forming a block of light emitting modules 102 to be subsequently divided into units will be explained. Dividing the block into units here similarly includes, in addition to the case of cutting the block into units each having a light source 20, cases of separating the block into units each having two or more light sources 20. The separated light emitting modules can be bonded to a wiring substrate 30 in the light emitting module bonding process described later.

Figure 15A:
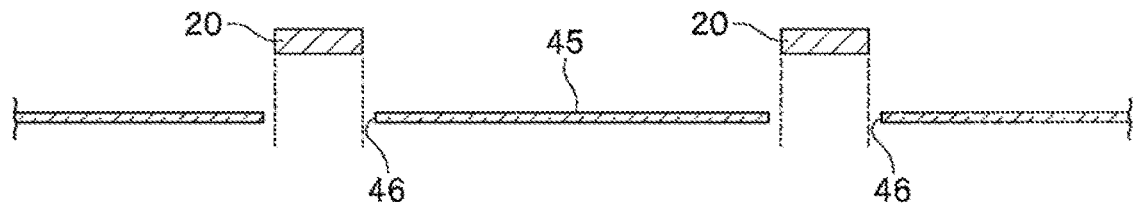
FIG. 15A is a schematic cross-sectional view illustrating a manufacturing method according to the third embodiment.

First, as shown in FIG. 15A, second through holes 46 where light sources 20 will be disposed are created in a second light reflecting sheet 45. The second through holes 46 can be created by punching using a punch shaped similarly to the planar shape of a light source 20. The second through holes 46 can alternatively be formed, for example, by drilling, laser processing, or the like, in addition to punching. A light reflecting sheet which already has second through holes 46 may be purchased.

Figure 15B:
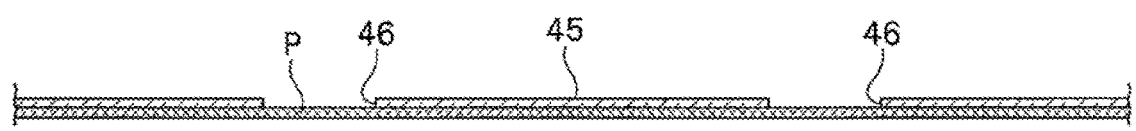
FIG. 15B is a schematic cross-sectional view illustrating the manufacturing method according to the third embodiment.
Figure 15C:
FIG. 15C is a schematic cross-sectional view illustrating the manufacturing method according to the third embodiment.
Figure 15D:
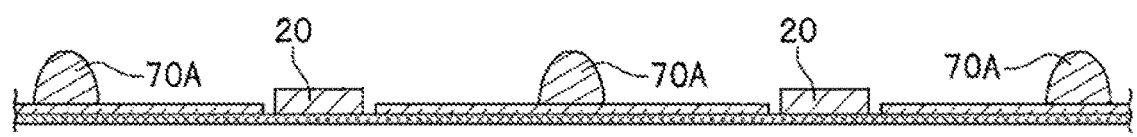
FIG. 15D is a schematic cross-sectional view illustrating the manufacturing method according to the third embodiment.
Figure 15E:
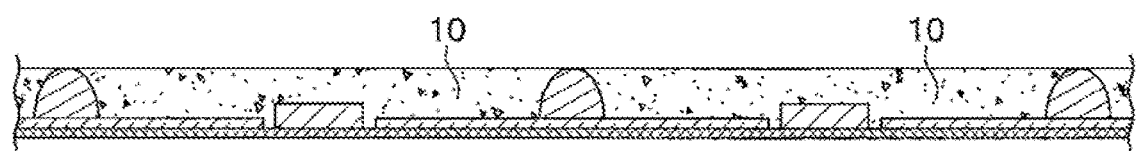
FIG. 15E is a schematic cross-sectional view illustrating the manufacturing method according to the third embodiment.
Figure 15F:
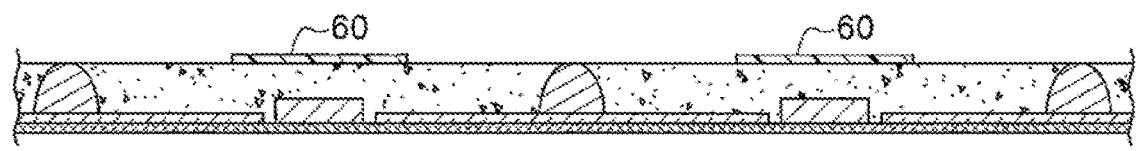
FIG. 15F is a schematic cross-sectional view illustrating the manufacturing method according to the third embodiment.
Figure 15G:
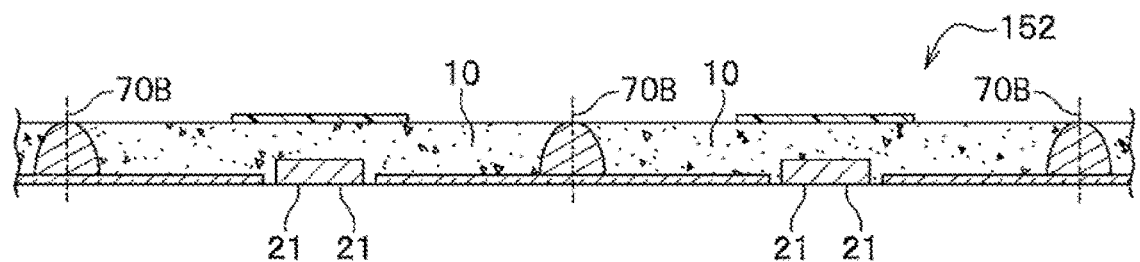
FIG. 15G is a schematic cross-sectional view illustrating the manufacturing method according to the third embodiment.

Next, as shown in FIG. 15B and FIG. 15C, a second light reflecting sheet 45 is placed on and secured to a support P, which will subsequently be removed, and light sources 20 are disposed in the second through holes 46.

Then as shown in FIG. 15D to FIG. 15G, in a similar manner to in the first embodiment, a light reflecting member 70A, light guide members 10, and light adjusting members 60 are formed. Then the support P is removed. At this stage, a block 152 of light emitting modules 102 prior to being divided has been formed.

Similar to the first embodiment, the places where the light sources 20 are disposed become the light source positioning parts 11 in the light guide members as a result. Since the lower faces of the light sources 20 are not covered by the light guide members 10, the electrodes 21 are exposed from the light guide members 10.

Figure 15H:
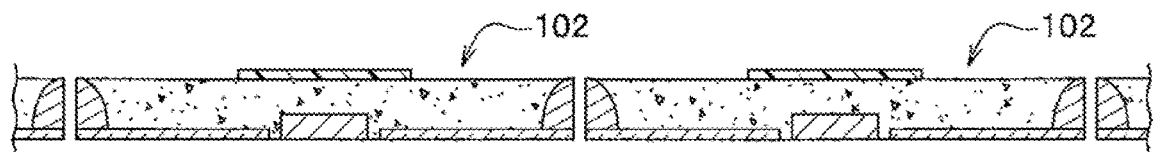
FIG. 15H is a schematic cross-sectional view illustrating the manufacturing method according to the third embodiment.

Then as shown in FIG. 15H, in a similar manner to in the first embodiment, the block 152 of light emitting modules 102 is cut along grid lines 70B in the light reflecting member 70A into individual units.

Wiring Substrate Preparation Process

A wiring substrate preparation process S2A is a process of preparing a first light reflecting sheet 40 and a wiring substrate 30 for bonding a light emitting module 102. The first through holes 41 of the first light reflecting sheet 40 are provided such that each first through hole faces an electrode 21 of a light source 20. The first light reflecting sheet 40 is disposed on the wiring substrate 30 in the positions where the wiring layer 32 faces the first through holes 41. Here, third through holes 31 are created in the wiring substrate 30 so as to pass through the wiring layer 32 and individually communicate with the first through holes 41.

In the wiring substrate preparation process S2A, it is preferable to simultaneously create the first through holes 41 of the first light reflecting sheet 40 and the third through holes 31 of the wiring substrate 30. In other words, it is preferable to successively create the first through holes 41 and the third through holes 31 by creating through holes facing the pairs of positive and negative electrodes 21 of the light sources 20 on a one-to-one basis in a laminated substrate 90A in which a first light reflecting sheet 40A not yet provided with first through holes 41 is adhered to the face of a wiring substrate 30A not yet provided with third through holes 31 to which light emitting modules 102 will be bonded.

Figure 16A:
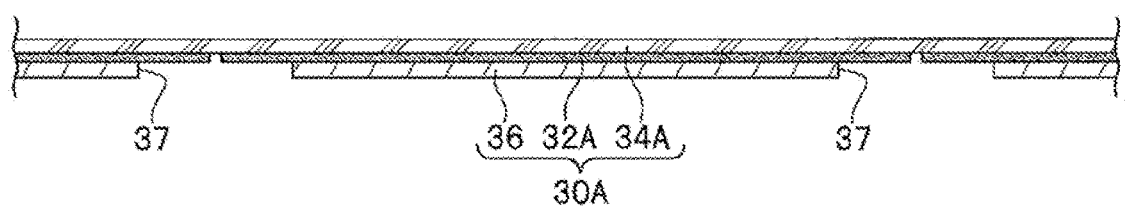
FIG. 16A is a schematic cross-sectional view illustrating the manufacturing method according to the third embodiment.
Figure 16B:
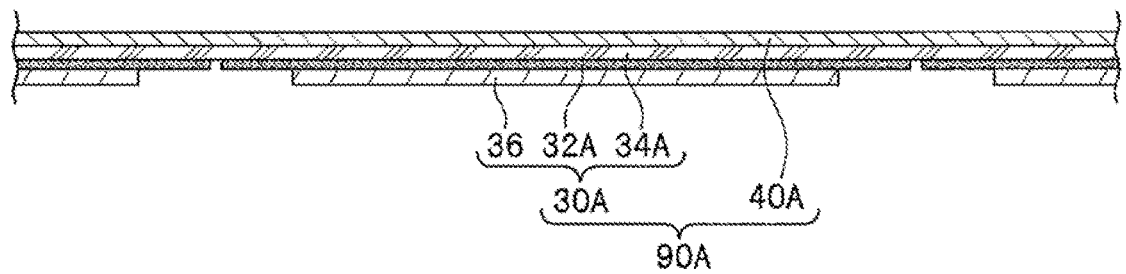
FIG. 16B is a schematic cross-sectional view illustrating the manufacturing method according to the third embodiment.
Figure 16C:
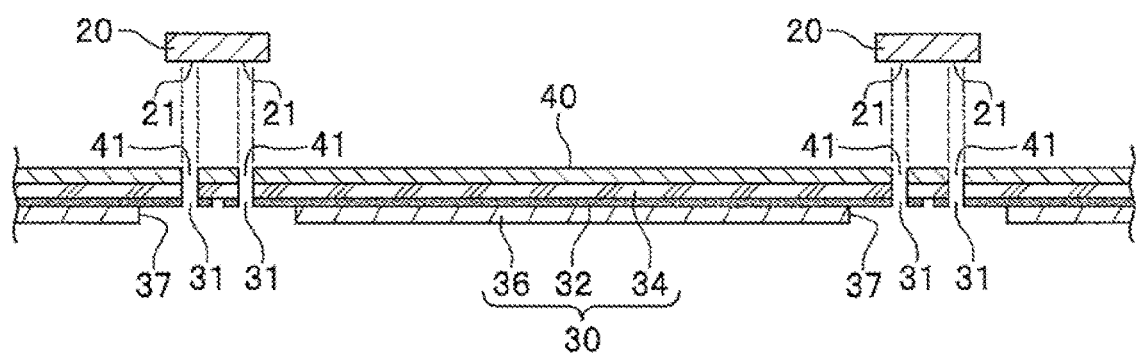
FIG. 16C is a schematic cross-sectional view illustrating the manufacturing method according to the third embodiment.

First, as shown in FIG. 16A, a wiring substrate 30A not yet provided with third through holes 31 is formed in a similar manner to in the first embodiment. Next, as shown in FIG. 16B, a laminated substrate 90A is formed by disposing a first reflecting sheet 40A not yet provided with first through holes 41 on the face of the wiring substrate 30A to which light emitting modules 102 will be bonded. Then as shown in FIG. 16C, through holes facing the electrodes 21 of light sources 20 are created in the laminated substrate 90A, one hole per electrode 21. Successively forming the first through holes 41 and the third through holes 31 in this manner can improve the alignment accuracy between the first light reflecting sheet 40 and the wiring substrate 30.

Light Emitting Module Bonding Process

A light emitting module bonding process S3A is a process of bonding the wiring substrate 30 and a light emitting modules 102.

Figure 17A:
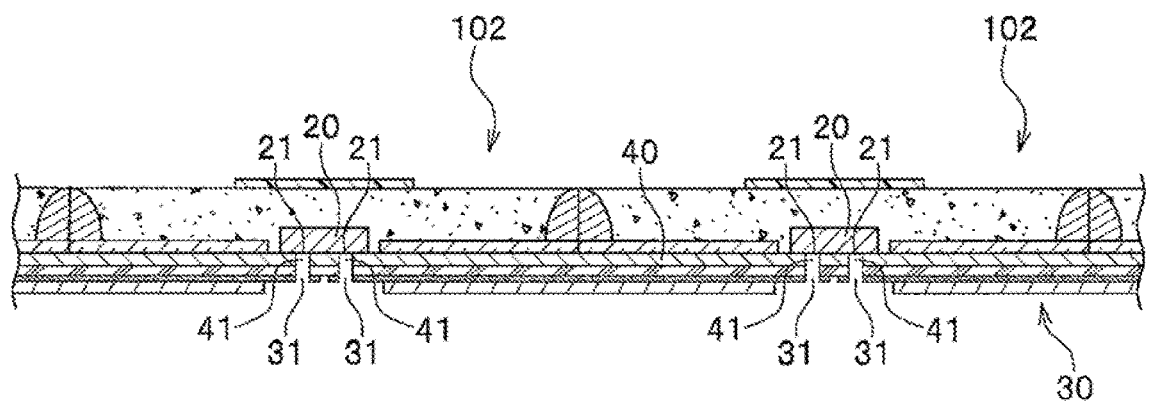
FIG. 17A is a schematic cross-sectional view illustrating the manufacturing method according to the third embodiment.

In the light emitting module bonding process S3A according to the third embodiment, the light emitting modules 102 are bonded to the wiring substrate 30 while interposing the first light reflecting sheet 40 such that the electrodes 21 face the first through holes 41. A bonding resin is applied to the first light reflecting sheet 40, and as shown in FIG. 17A, the light emitting modules 102 are bonded after aligning them such that the electrodes 21 face the first through holes 41. The bonding resin is not shown in the drawing. Using an adhesive sheet as the first reflecting sheet 40 can omit the coating of a bonding resin.

The wiring substrate 30 after bonding the light emitting modules 102, when viewed from the face not having the light emitting modules 102, have the third through holes 31 communicating with the first through holes 41, and the far ends of the first through holes 41 are closed by the electrodes 21 of the light sources 20. In other words, as many holes as the electrodes 21 each having an electrode 21 as the bottom and a third through hole 31 as the inlet are created. Each region 25 between a pair of positive and negative electrodes 21 in the face of a light source 20 having the electrodes 21 faces the first light reflecting sheet 40.

Connection Process and Protective Member Forming Process

Figure 17B:
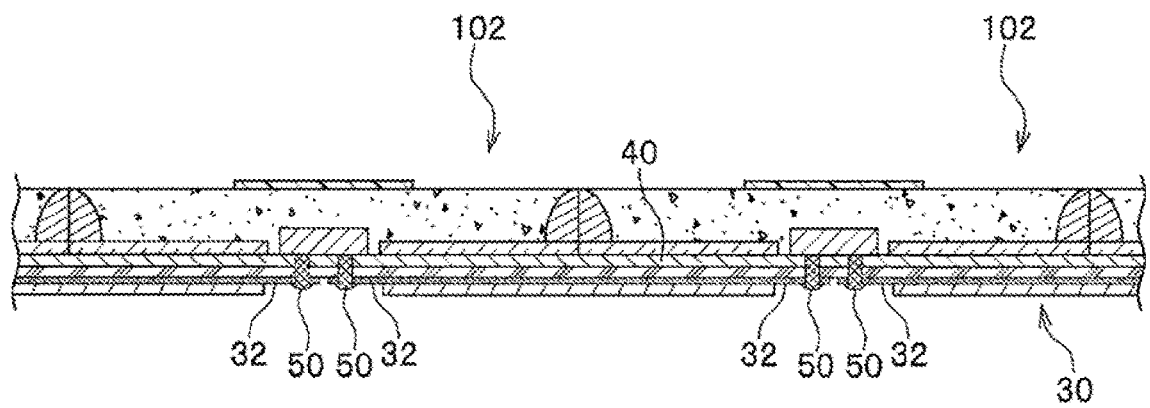
FIG. 17B is a schematic cross-sectional view illustrating the manufacturing method according to the third embodiment.
Figure 17C:
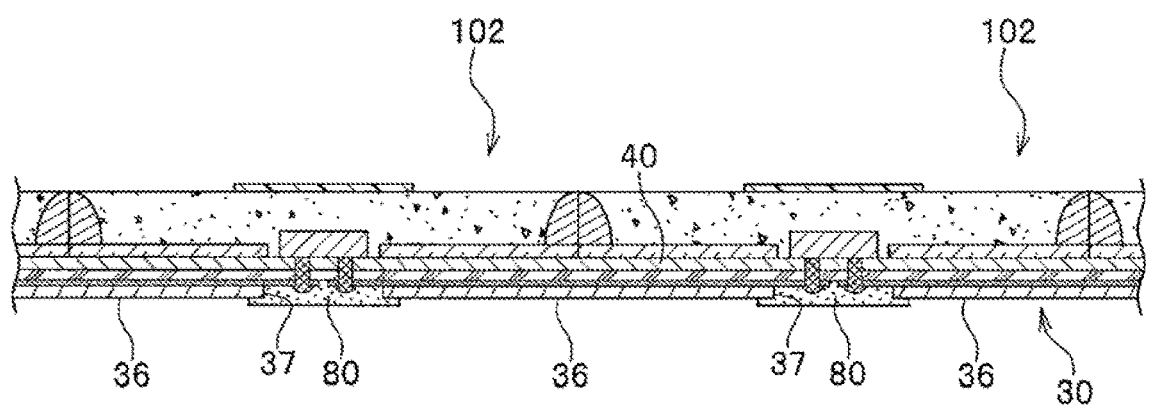
FIG. 17C is a schematic cross-sectional view illustrating the manufacturing method according to the third embodiment.

As shown in FIG. 17B, a connection process S4 is performed in a similar manner to in the first embodiment. By successively performing a protective member forming process S5, as shown in FIG. 17C, protective members 80 can be formed to cover, for example, the conducting members 50 and the exposed wiring layer 32, as well as the cover layer 36 located around the openings 37.

Variations of Light Source

Light sources are not limited to the light sources 20 already described. For example, a light source having a pair of positive and negative electrodes 21 on one face, and a blue or white emission color, can be used. Variations of the light source 20 will be explained with reference to FIG. 18A to FIG. 18D.

Figure 18A:
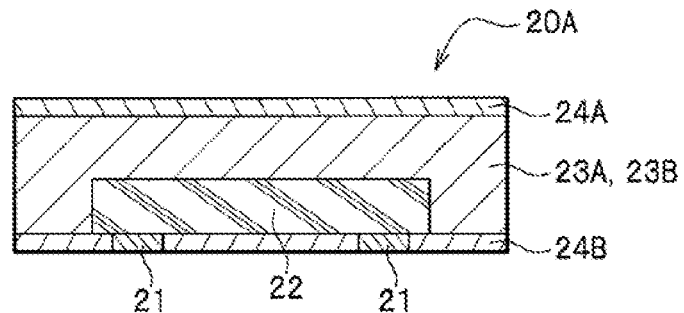
FIG. 18A is a schematic cross-sectional view of a variation of a light source.

As shown in FIG. 18A, a light source 20A has a blue light emitting element 22 and a light transmissive member 23A. The light transmissive member 23A contains a phosphor which emits yellow light, and can make the emission color of the light source 20A white. The light source 20A further includes a first light adjusting member 24A on the upper face and a light reflecting layer 24B on the lower face which has the electrodes 21. The light source 20A having the light reflecting layer 24B on the face having the electrodes 21 can reduce the light that reaches the wiring layer 32.

Figure 18B:
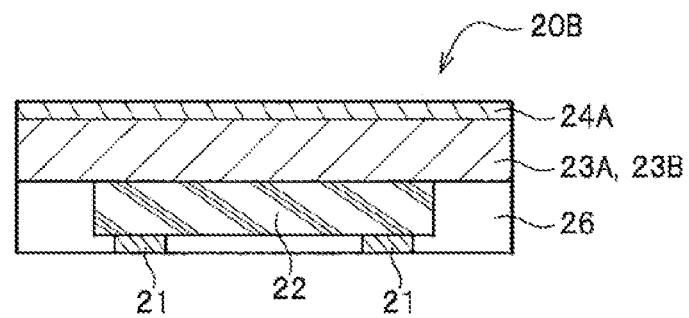
FIG. 18B is a schematic cross-sectional view of a variation of a light source.

As shown in FIG. 18B, a light source 20B which includes a blue light emitting element 22 and a light transmissive member 23A can emit white light. The light source 20B further includes a first light adjusting member 24A on the upper face.

The light transmissive member 23A of the light source 30B is disposed on the light emitting element 22. The lateral faces and the lower face of the semiconductor stack of the light emitting element 22 and the lower face of the light transmissive member 23A are covered by the cover member 26. The cover member 26 is a member that covers and protects the light emitting element 22 as well as reflecting the light from the light emitting element 22 towards the light transmissive member 23A. Examples of materials for use as the cover member 26 include silicone resins, epoxy resins, acrylic resins, and the like. The cover member 26 contains a light diffusing material, such as titania, barium titanate, aluminum oxide, silicon oxide, or the like.

The light transmissive member 23A of the light sources 20A and 20B may be a light transmissive member 23B which does not contain any phosphor. Moreover, the light transmissive members 23A and 23B can contain a light diffusing material. Examples of materials for use as a light diffusing material include titania, barium titanate, aluminum oxide, silicon oxide, and the like.

The light sources 20A and 20B may have a light reflecting layer 24B on the lower face side of the light emitting element 22, but not a first light adjusting member 24A, or have neither the first light adjusting member 24A nor the light reflecting layer 24B.

Figure 18C:
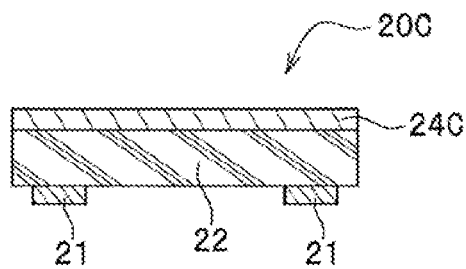
FIG. 18C is a schematic cross-sectional view of a variation of a light source.
Figure 18D:
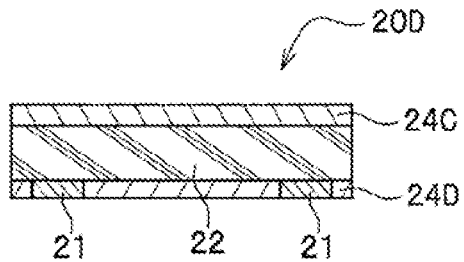
FIG. 18D is a schematic cross-sectional view of a variation of a light source.

As shown in FIG. 18C and FIG. 18D, a light source 20C or 20D in which the light emitting element 22 is not sealed by the light transmissive member 23A and the cover member 26 can be used as variations of the light source 20. In the light source 20C, the first light adjusting member 24C is disposed on the upper face of the light emitting element 22. The light source 20D is a light source 20C further including a light reflecting layer 24D on the face having the electrodes 21.

For the material used in forming the first light adjusting member 24A or 24C, similar to the first embodiment, a resin material containing a light diffusing material, or a metal material can be used. For the first light adjusting member 24A or 24C, a multilayer dielectric film, or a film made by stacking a multilayer dielectric film and a metal film, may be used.

Variations of Light Guide Member Forming Method

In the manufacturing method according to the first embodiment, the light guide member 10 is formed by hardening a liquid state resin, but a preformed light guide member (hereinafter referred to as a light guide plate) may alternatively be used. Liquid state here includes paste. The method will be explained here as a variation of the first embodiment, but can be similarly applied to other embodiments.

Figure 19A:
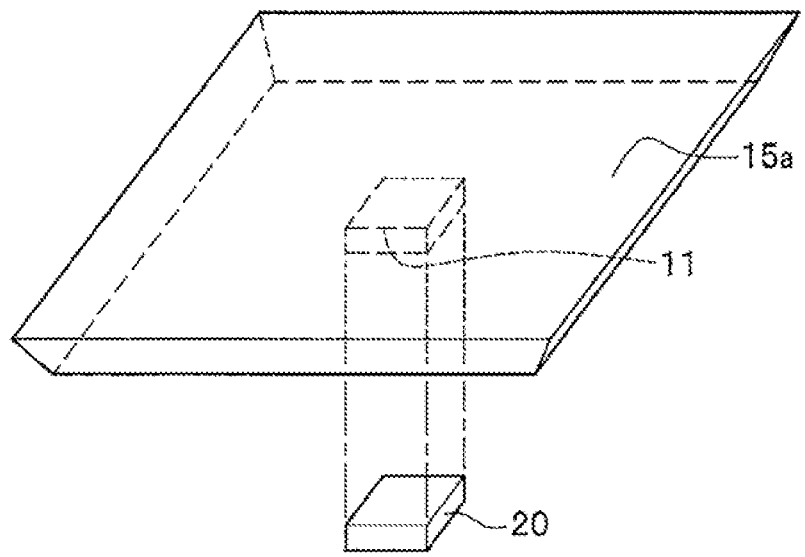
FIG. 19A is a schematic cross-sectional view of a variation of a light guide member.

The light guide plate 15a, as shown in FIG. 19A, has in the lower face a light source positioning part 11 which is recessed in size to enclose a light source 20, covering the light source 20 so as to expose the electrodes 21. The light source 20 is disposed in the light source positioning part 11 via a light transmissive adhesive.

Figure 19B:
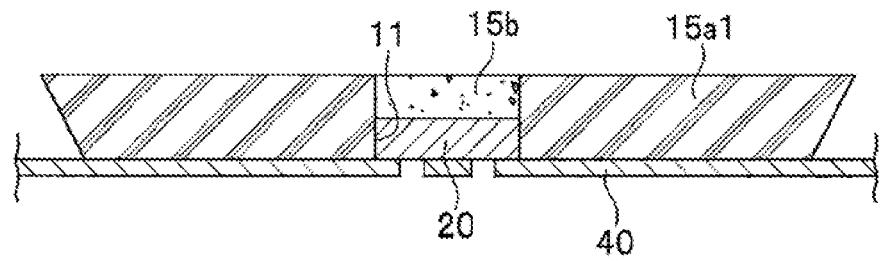
FIG. 19B is a schematic cross-sectional view of a variation of a light guide member.

As shown in FIG. 19B, the light source positioning part 11 may be a through hole. The light guide part 15b can alternatively be formed by disposing a light source 20 in the through hole of a light guide plate 15a1, injecting a liquid state resin to cover the upper face of the light source 20, and hardening the resin. In this example, the light guide member composed of the light guide plate 15a1 and the light guide part 15b covers the light source 20 so as to expose the electrodes 21. The resin material used to form the light guide plate 15a1 and the resin material used to form the light guide part 15b may be the same or different. Furthermore, the light guide plate 15a1 may be of a single layer or multiple layers. For example, in the case where the light guide plate 15a1 is of a multilayer structure, adhesive sheets can be used between layers. Any material having light transmitting properties relative to the outgoing light from the light source 20 can be used as the material for such adhesive sheets, but the same material as that used for the light guide plate 15a1 is preferably used so as to prevent any interlayer interface from forming.

Figure 19C:
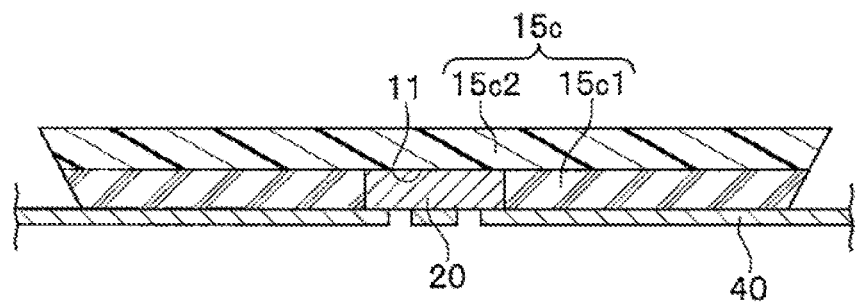
FIG. 19C is a schematic cross-sectional view of a variation of a light guide member.

As shown in FIG. 19C, a light guide member 15c which includes a first light guide plate 15c1 and a second light guide plate 15c2 may alternatively be used. The first light guide plate 15c1 has a through hole in which a light source 20 is placed. The thickness of the first light guide plate 15c1 is substantially the same as the thickness of the light source 20. The second light guide plate 15c2 is disposed across the upper face of the light source 20 and the upper face of the first light guide plate 15c1. In this example, the recess formed by combining the first guide plate 15c1 and the second light guide plate 15c2 becomes the light source positioning part 11, and the light guide member 15c covers the light source 20 so as to expose the electrodes 21. The resin materials used to form the first light guide plate 15c1 and the second light guide plate 15c2 may be the same or different.

Figure 20A:
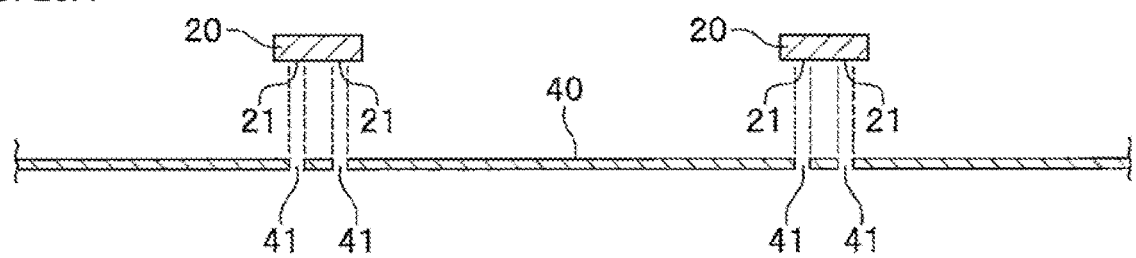
FIG. 20A is a schematic cross-sectional view illustrating a manufacturing method according to a variation of a light guide member.
Figure 20B:
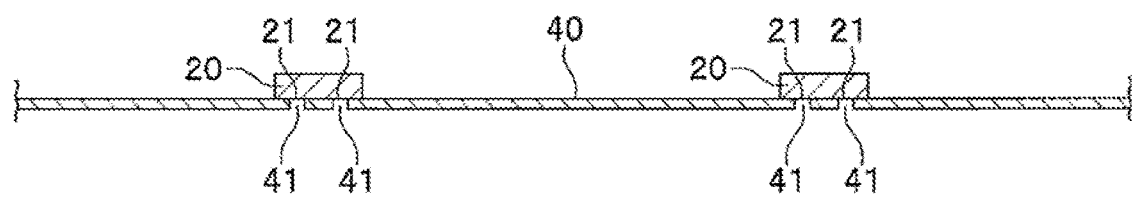
FIG. 20B is a schematic cross-sectional view illustrating the manufacturing method according to the variation of a light guide member.
Figure 20C:
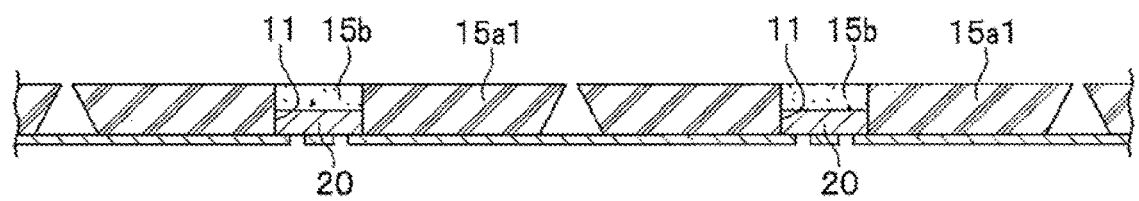
FIG. 20C is a schematic cross-sectional view illustrating the manufacturing method according to the variation of a light guide member.
Figure 20D:
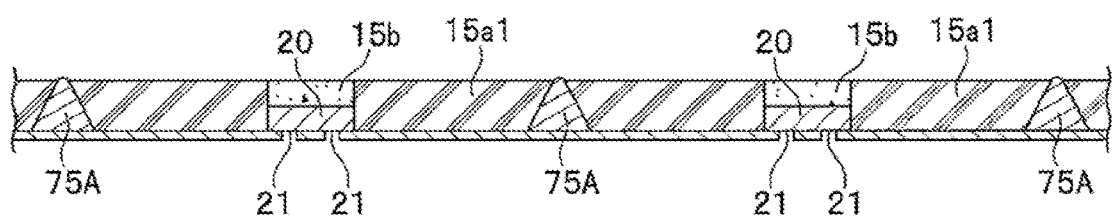
FIG. 20D is a schematic cross-sectional view illustrating the manufacturing method according to the variation of a light guide member.
Figure 20E:
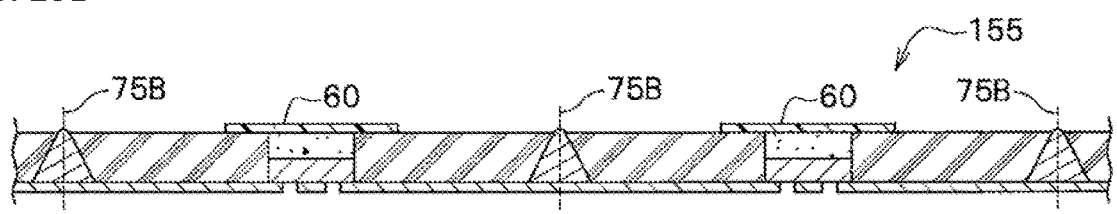
FIG. 20E is a schematic cross-sectional view illustrating the manufacturing method according to the variation of a light guide member.
Figure 20F:
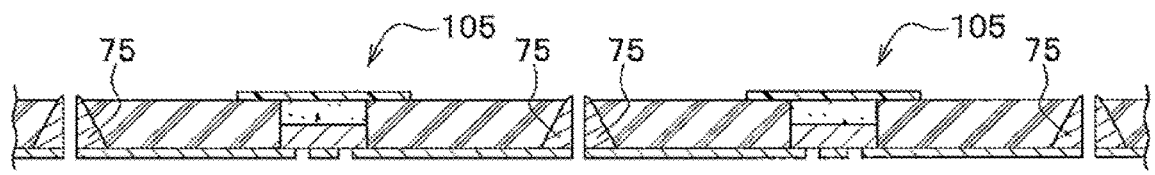
FIG. 20F is a schematic cross-sectional view illustrating the manufacturing method according to the variation of a light guide member.

In the case of using light guide plates, as shown in FIG. 20C and FIG. 20D, a light reflecting member 75A is disposed after disposing the light guide plates 15a1 on the first light reflecting sheet 40. In this case, certain changes are made to the light emitting module preparation process. A light emitting module preparation process S1B which employs light guide plates 15a1 will be explained as an example with reference to FIG. 20A to FIG. 20F.

Light sources 20 are disposed on a first light reflecting sheet 40 having first through holes 41 after aligning to oppose the first through holes 41 to the electrodes 21 in a similar manner to in the light emitting module preparation process S1 of the first embodiment.

Then light guide plates 15a1 are disposed next to one another on the first light reflecting sheet 40 so as to house the light sources 20 in the light source positioning parts 11. A resin to form the light guide parts 15b is injected into the light source positioning parts 11 in the through holes to cover the light sources 20 and hardened. The light guide members composed of the light guide plates 15a1 and the light guide parts 15b cover the light sources 20 so as to expose the electrodes 21.

Then a material for forming the light reflecting member 75A is injected into the gaps between adjacent light guide plates 15a1 and hardened. Light adjusting members (second light adjusting members) 60 are disposed on the light guide plates 15a1 and the light guide parts 15b in a similar manner to in the first embodiment. Then the block 155 of light emitting modules 105 is cut along the grid lines 75B in the light reflecting member 75A into individual units. Each second light adjusting member 60 in this embodiment covers the entire upper surface of the light guide part 15b, but the upper face of the light guide part 15b may be partially exposed from the second light adjusting member 60.

In the case of forming the light reflecting member 75A by coating with or injecting a resin in the gaps between the light guide members and hardening the resin in this manner, the light reflecting member 75A is formed along the shapes of the outer lateral faces of the light guide members. Accordingly, the shapes of the inner lateral faces of the light reflecting members 75 can be adjusted by preliminarily adjusting the shapes of the outer faces of the light guide members.

As another variation of the first embodiment, the air can be used as a light guide member.

Variation of Wiring Substrate

Figure 21:
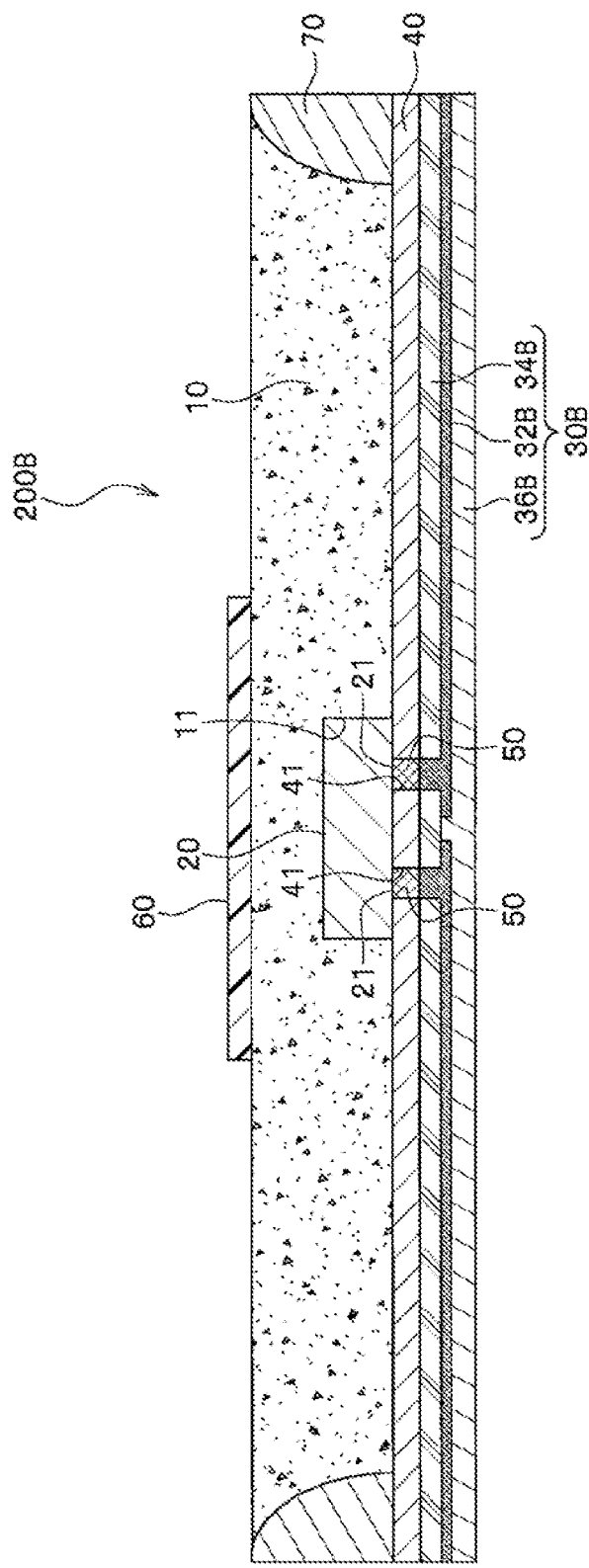
FIG. 21 is a schematic cross-sectional view of a planar light source having a wiring substrate according to a variation of the embodiment.
Figure 22:
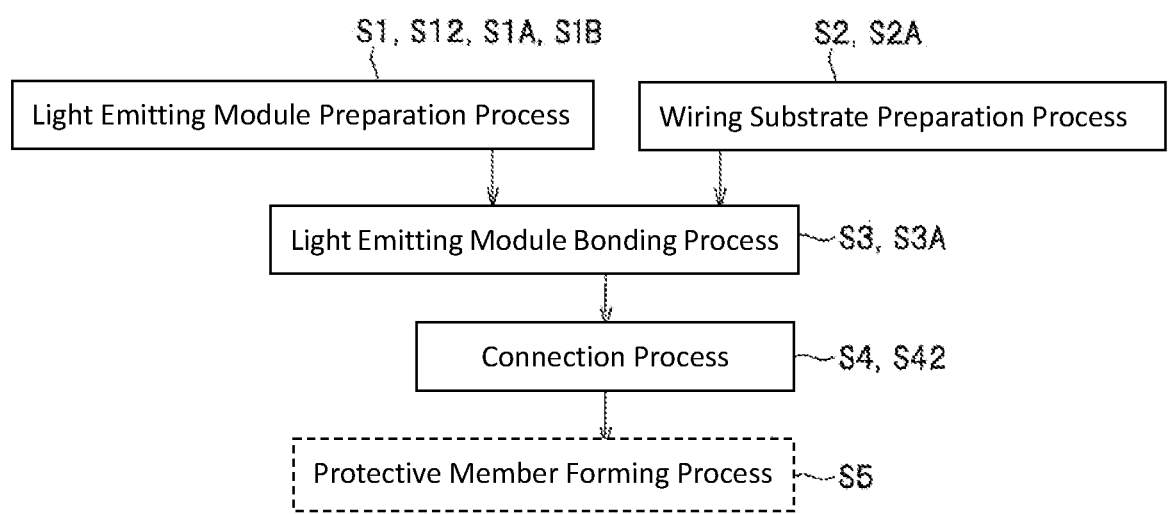
FIG. 22 is a flowchart of a method of manufacturing a planar light source according to the embodiment.

A variation of the wiring substrate will be explained with reference to FIG. 21. In this example, the wiring substrate 30B does not have third through holes 31. It is constructed as described below. The electrical contact between the conducting members 50 and the wiring layer 32 is established at the contact portions of the face of the wiring layer 32 on the light reflecting sheet 40 side that individually faces the first through holes 41.

The insulation base 34B has openings each facing a first through hole 41 of the light reflecting sheet 40 in which the wiring layer 32B is exposed. The wiring layer 32B is thicker in the direction of thickness of the wiring substrate 30B at the contact portions facing the first through holes 41 than the remaining portion. In this variation, moreover, the surface of the wiring layer 32B at the contact portions facing the first through holes 41 and the surface of the insulating base 34B are substantially coplanar. Conducting members 50 are disposed between the wiring layer 32B and the electrodes 21 via the first through holes 41. The wiring layer 32B at the contact portions facing the first through holes 41 may protrude from the surface of the insulation base 34B, or be lower than the surface of the insulating base 34B. The thickness of the wiring layer 32B at the contact portions facing the first through holes 41 can be adjusted by the thickness of each conducting member 50.

In the method of manufacturing a planar light source employing a wiring substrate 30B without third through holes 31, for example, in the light emitting module bonding process, the conducting members 50 are disposed on the wiring layer 32B before bonding the light emitting modules. In other words, the conducting members 50 are disposed on the upper faces of the wiring layer 32B before bonding the light emitting modules. At this time, the conducting members 50 are connected to the electrodes 21 of the light sources 20 via the first through holes 41. The electrical contact between the conducting members 50 and the wiring layer 32B is established at the contact portions of the wiring layer 32B on the first light reflecting sheet 40 side that face the first through holes 41.

The wiring substrate 30B does not require any opening 37 in the cover layer 36B. This eliminates the need to dispose a protective member 80 that cover an opening 37, reducing the number of processes in the manufacturing method.

The wiring substrate according to this variation can similarly be applied to the first embodiment and other embodiments. For example, the conducting members 50 may be preliminarily disposed in the first through holes 41 of the first light reflecting member 40 as in the case of a light emitting module 101 according to the second embodiment. In this case, the conducting members 50 are bonded to the electrodes 21 of the light sources 20 and the wiring layer 32B using solder or the like. The wiring layer may be of a single layer or multiple layers. The embodiment in which the wiring substrate has third through holes 31 and the variation without third through holes 31 can similarly be applied a wiring layer of a multilayer structure.

What is claimed is:

1. A method of manufacturing a planar light source, the method comprising:
preparing a wiring substrate on which a first light reflecting sheet defining a pair of first through holes is disposed, the wiring substrate having a wiring layer;

preparing a light emitting module including a light source having a pair of electrodes on one face, a second light reflecting sheet defining a second through hole with the light source being disposed in the second through hole in a plan view, and a light guide member covering the light source while the electrodes are exposed from the light guide member;

bonding the light emitting module to the wiring substrate with the first light reflecting sheet being interposed between the light emitting module and the wiring substrate such that the first through holes are aligned with the electrodes on a one-to-one basis; and electrically connecting the electrodes and the wiring layer via conducting members disposed in the first through holes.

2. The method of manufacturing a planar light source according to claim 1, wherein the preparing of the wiring substrate includes preparing a laminated substrate in which the wiring substrate is adhered to the first light reflecting sheet not yet provided with the first through holes, and successively forming the first through holes in the first light reflecting sheet and forming a pair of third through holes passing through the wiring layer and communicating with the first through holes on a one-to-one basis by forming through holes in the laminated substrate, and the electrically connecting of the electrodes and the wiring layer includes establishing electrical contact between each of the conducting members and the wiring layer at least on an inside of a corresponding one of the third through holes.

3. The method of manufacturing a planar light source according to claim 1, wherein the electrically connecting of the electrodes and the wiring layer includes establishing electrical contact between each of the conducting members and the wiring layer on a face of the wiring layer opposite a side on which the first light reflecting sheet is disposed.

* * * * *